United States Patent
Kato et al.

(10) Patent No.: US 6,856,550 B2
(45) Date of Patent: Feb. 15, 2005

(54) NONVOLATILE SEMICONDUCTOR MEMORY DEVICE CAPABLE OF UNIFORMLY INPUTTING/OUTPUTTING DATA

(75) Inventors: Hiroshi Kato, Hyogo (JP); Yasuhiko Taito, Hyogo (JP); Tsukasa Ooishi, Hyogo (JP); Jun Ohtani, Hyogo (JP)

(73) Assignee: Renesas Technology Corporation, Tokyo (JP)

( * ) Notice: Subject to any disclaimer, the term of this patent is extended or adjusted under 35 U.S.C. 154(b) by 25 days.

(21) Appl. No.: 10/298,666

(22) Filed: Nov. 19, 2002

(65) Prior Publication Data

US 2003/0218897 A1 Nov. 27, 2003

(30) Foreign Application Priority Data

May 23, 2002 (JP) .................................... 2002-149193

(51) Int. Cl.$^7$ ................................................ G11C 7/00
(52) U.S. Cl. ............................ 365/185.28; 365/185.22; 365/185.24; 365/185.03; 365/205; 365/189.01
(58) Field of Search ...................... 365/185.01, 185.28, 365/185.22, 185.24, 185.03, 205, 189.01

(56) References Cited

U.S. PATENT DOCUMENTS

| | | | |
|---|---|---|---|
| 5,768,192 A | | 6/1998 | Eitan |
| 5,844,841 A | * | 12/1998 | Takeuchi et al. ........ 365/185.03 |
| 6,002,152 A | * | 12/1999 | Guterman et al. .......... 257/316 |
| 6,011,725 A | | 1/2000 | Eitan |
| 6,064,591 A | * | 5/2000 | Takeuchi et al. ........ 365/185.03 |
| 6,201,733 B1 | * | 3/2001 | Hiraki et al. ........... 365/185.08 |
| 6,215,702 B1 | | 4/2001 | Derhacobian et al. |
| 6,243,295 B1 | * | 6/2001 | Satoh .................... 365/185.17 |
| 6,266,281 B1 | | 7/2001 | Derhacobian et al. |
| 6,285,597 B2 | * | 9/2001 | Kawahara et al. ...... 365/185.24 |
| 6,331,951 B1 | * | 12/2001 | Bautista et al. ......... 365/185.22 |
| 6,490,204 B2 | * | 12/2002 | Bloom et al. ........... 365/185.28 |
| 6,493,266 B1 | * | 12/2002 | Yachareni et al. ...... 365/185.22 |
| 6,512,701 B1 | * | 1/2003 | Hamilton et al. ....... 365/185.29 |
| 6,538,926 B2 | * | 3/2003 | Kato et al. ............. 365/185.28 |
| 6,670,669 B1 | * | 12/2003 | Kawamura .................. 257/314 |
| 6,704,222 B2 | * | 3/2004 | Guterman et al. ...... 365/185.03 |

FOREIGN PATENT DOCUMENTS

| | | | | |
|---|---|---|---|---|
| JP | 10-228784 | | 8/1998 | |
| JP | 10-228786 | | 8/1998 | |
| JP | 02000030471 A | * | 1/2000 | ........... G11C/16/02 |

OTHER PUBLICATIONS

"Can NROM, a 2 bit, Trapping Storage NYM Cell, Give a Real Challenge to Floating Gate Cells?", Boaz Eitan et al., the 1999 International Conference on Solid State Devices and Materials, Tokyo, Sep. 1999, pp. 522–524.

Related U.S. Appl. No. 10/146,021 filed May 16, 2002 (Our Reference No. 57454–581).

Related U.S. Appl. No. 10/146,031 filed May 16, 2002 (Our Reference No. 57454–562).

Related U.S. Appl. No. 10/211,338 filed Aug. 5, 2002 (Our Reference No. 57454–703.)

* cited by examiner

Primary Examiner—Viet Q. Nguyen
(74) Attorney, Agent, or Firm—McDermott Will & Emery LLP

(57) ABSTRACT

At the time of an operation of writing data to a specific memory cell in a memory block, a semiconductor memory device applies a write voltage for a predetermined period and, after that, performs a verifying operation by using a sense amplifier circuit and a comparator. When it is found as a result of the verifying operation that writing to the memory cell is insufficient, the writing operation is performed again by an instruction of a memory control circuit. At this time, the memory control circuit adjusts a write voltage.

10 Claims, 32 Drawing Sheets

NONVOLATILE SEMICONDUCTOR MEMORY DEVICE CAPABLE OF UNIFORMLY INPUTTING/OUTPUTTING DATA

BACKGROUND OF THE INVENTION

1. Field of the Invention

The present invention relates to a nonvolatile semiconductor memory device, and more particularly to a nonvolatile semiconductor memory device capable of storing multi values.

2. Description of the Background Art

Among nonvolatile semiconductor memory devices, attention is being paid to an NROM (Nitride Read Only Memory) type flash EEPROM (hereinafter, referred to as NROM) as a kind of a flash EEPROM. An NROM is disclosed in U.S. Pat. Nos. 6,011,725 and 5,768,192.

FIG. 29 is a cross sectional view of a conventional flash EEPROM.

Referring to FIG. 29, a flash EEPROM includes a semiconductor substrate 1, a drain region 2, a source region 3, a floating gate 4, an insulating film 5, and a control gate 6.

Drain region 2 and source region 3 are formed with a predetermined interval in the main surface of semiconductor substrate 1. Floating gate 4 is formed on semiconductor substrate 1 between drain region 2 and source region 3. Control gate 6 is formed on floating gate 4. The surfaces of floating gate 4 and control gate 6 are covered with insulating film 5.

In the flash EEPROM, electrons are accumulated in floating gate 4. Therefore, floating gate 4 is covered with insulating film 5. Insulating film 5 prevents leakage of electrons from floating gate 4.

In the conventional flash EEPROM, it is difficult to thin insulating film 5. If insulating film 5 is thin, electrons are leaked from floating gate 4 and, as a result, data written in the flash EEPROM is easily dissipated. Therefore, it is limited to make the flash EEPROM finer.

FIG. 30 is a cross sectional view of a memory cell used for an NROM.

Referring to FIG. 30, the NROM includes semiconductor substrate 1, two diffusion bit lines 7A and 7B, oxide films 8 and 10, a nitride film 9, and a control gate 11.

Two diffusion bit lines 7A and 7B are formed with a predetermined interval in the main surface of semiconductor substrate 1. Oxide film 8 is formed on semiconductor substrate 1 between two diffusion bit lines. Nitride film 9 is formed on oxide film 8. Oxide film 10 is formed on nitride film 9. Control gate 11 is formed on oxide film 10.

In the NROM, electrons can be accumulated in each of storing regions 9L and 9R in nitride film 9. That is, by accumulating electrons in physically different two positions in one cell, the NROM can store data of two bits per cell.

The electrons accumulated in storing regions 9L and 9R in nitride film 9 cannot freely move in nitride film 9 and remain in storing regions 9L and 9R for the reason that nitride film 9 is an insulating film.

The NROM is easily manufactured and the price is low. A memory cell array to which the NROM is applied has a configuration that diffusion bit lines and word lines cross perpendicular to each other. A diffusion bit line is shared by adjoining memory cells. Consequently, the area of the memory cell array can be reduced as compared with the conventional flash EEPROM.

An operation of writing data to the NROM is performed by injecting hot electrons to a channel. An operation of erasing data in the NROM is performed by injecting hot holes generated by tunneling between bands. In a reading mode, a current is passed in the direction opposite to that in a writing mode. The moving direction of electrons in the reading mode from storing region 9L is therefore the same as that in the writing mode to storing region 9R.

FIGS. 31A to 31D are diagrams showing the operations of writing/reading data to/from two storing regions 9L and 9R in an NROM type memory cell.

Referring to FIG. 31A, a memory cell MC is a memory cell of the NROM type. The gate of memory cell MC is connected to a word line WL. It is assumed that memory cell MC is connected to bit lines BL0 and BL1. Memory cell MC has storing region 9L on a bit line BL0 side and has, as shown in FIG. 31C, storing region 9R on bit line BL1 side.

First, the writing operation to storing region 9L will be described. Referring to FIG. 31A, in the case of writing data to storing region 9L, word line WL is activated. The potential of bit line BL0 is maintained at a write potential VCCW, and the potential of bit line BL1 is maintained at a ground potential GND. As a result, a write current Ifw flows from bit line BL0 to bit line BL1 via nonvolatile memory cell MC. At this time, data is written in storing region 9L.

Next, the operation of reading data from storing region 9L will be described. Referring to FIG. 31B, in the case of reading data of storing region 9L, word line WL is activated. The potential of bit line BL0 is maintained at ground potential GND, and the potential of bit line BL1 is maintained at a read potential VCCR. By detecting whether a read current Ifr flows from bit line BL1 to bit line BL0, data is read.

As described above, in storing region 9L, the current direction in the writing operation and that in the reading operation are opposite to each other.

The writing operation to storing region 9R will now be described. Referring to FIG. 31C, in the case of writing data to storing region 9R, word line WL is activated. The potential of bit line BL0 is maintained at ground potential GND, and the potential of bit line BL1 is maintained at write potential VCCW. As a result, write current Irw flows from bit line BL1 to bit line BL0. At this time, data is written in storing region 9R.

Next, the operation of reading data from storing region 9R will be described. Referring to FIG. 31D, in the case of reading data of storing region 9R, word line WL is activated. The potential of bit line BL0 is maintained at read potential VCCR and the potential of bit line BL1 is maintained at ground potential GND. By detecting whether a read current Irr flows from bit line BL0 to bit line BL1, data is read.

As described above, in the writing operation of the NROM, if a predetermined potential is applied to each of diffusion bit line and control gate, electrons can be accumulated in storing region 9L or 9R. However, if a potential is excessively applied in the writing operation, the following problems occur.

(1) There is the possibility that a threshold value of a memory cell becomes too high and data cannot be erased in a designated period in an erasing operation for the reason that if a potential is excessively applied at the time of a writing, excessive electrons are accumulated in nitride film 9. This problem can happen also in a conventional flash EEPROM.

(2) There is the possibility that data of two bits cannot be stored in each cell (hereinafter, referred to as two bits/cell).

Specifically, in the NROM, it is necessary to accurately read storing region 9R irrespective of the state of storing region 9L and accurately read storing region 9L irrespective of the state of storing region 9R.

FIGS. 32A and 32B are diagrams for describing the reading operation of the NROM. FIGS. 32A and 32B show the case where electrons are accumulated in storing region 9L and electrons are not accumulated in storing region 9R.

FIG. 32A shows an NROM on which the writing operation is accurately performed, and FIG. 32B shows an NROM in which electrons are excessively accumulated in the writing operation.

Referring to FIG. 32A, in the case of reading data from storing region 9R, a predetermined potential is applied to diffusion bit line 7 and control gate 11. At this time, a depletion layer is expanded to a range V in semiconductor substrate 1. If the operation of writing data to storing region 9L is performed normally, the distribution of electrons stored in storing region 9L lies within the range V. In this case, therefore, data of storing region 9R is read normally.

On the other hand, in the case of FIG. 32B, in the operation of reading data from storing region 9R, the depletion layer is expanded to the range V. However, a potential is excessively applied at the time of writing data to storing region 9L, the electron distribution expands to a range E. In the case of reading data from storing region 9R, due to the electron distribution exceeding the range V of the depletion layer, the threshold value increases. As a result, it may be erroneously recognized that storing region 9R is in a programmed state. This problem does not occur in a conventional flash EEPROM using the floating gate.

(3) There is the possibility that, in the writing operation, a part of electrons to be accumulated in storing regions 9L and 9R is accumulated in a position apart from each diffusion bit line.

FIG. 33 is a schematic diagram showing a state where a part of electrons is accumulated in a position apart from each diffusion bit line in the writing operation.

In FIG. 33, a part of electrons is stored in regions 12 and 13 apart from diffusion bit lines 7A and 7B, respectively.

In the case where electrons are stored in positions as shown in FIG. 33, even if a specific erase voltage is applied, all of the accumulated electrons cannot be erased. A region in which a strong electric field is generated when the erase voltage is applied is a portion in which the control gate and each diffusion bit line are adjacent to each other. The electrons accumulated in the adjacent portion are neutralized with holes injected at the time of erasing in the whole regions 9L and 9R. However, in the case where electrons are accumulated in positions such as regions 12 and 13 as shown in FIG. 33, a sufficient electric field is not applied to the regions in which a part of electrons are accumulated, so that holes for neutralizing electrons stored in the region are not sufficiently injected. As a result, the electrons in regions 12 and 13 are not neutralized as a whole. Therefore, the threshold value does not decrease after the erasing operation, so that resistance characteristic of the NROM deteriorates. This problem occurs due to a property peculiar to the NROM such that electrons cannot move in the electron accumulating layer at the time of programming. In a conventional flash EEPROM, as electrons and holes can freely move in the floating gate, such a problem cannot occur.

In order to solve the problems, it is necessary to suppress variations in the threshold value of a memory cell in the writing and erasing operations. That is, it is necessary to prevent application of an excessive write voltage at the time of a writing operation.

SUMMARY OF THE INVENTION

Therefore, an object of the present invention is to provide a nonvolatile semiconductor memory device capable of suppressing variations in a threshold value of a memory cell.

A nonvolatile semiconductor memory device according to the present invention includes a semiconductor substrate, a plurality of memory blocks, a plurality of word lines, a plurality of bit lines, and a control circuit. The plurality of memory blocks includes a plurality of nonvolatile memory cells arranged in a matrix. The plurality of word lines are arranged in correspondence with a row direction of the plurality of memory cells. The plurality of bit lines are arranged in correspondence with a column direction of the plurality of memory cells. The control circuit performs a writing operation on the plurality of memory cells at the time of a writing operation. Each of the plurality of memory cells includes first and second conductive regions and an insulating film. The first and second conductive regions are formed in a main surface of the semiconductor substrate and connected to corresponding bit lines in the plurality of bit lines. The insulating film is formed on the semiconductor substrate between the first and second conductive regions, and has a first storing region in the vicinity of the first conductive region and a second storing region in the vicinity of the second conductive region. The control circuit applies at least one pulse voltages to a selected memory cell in the plurality of memory cells.

With the configuration, the nonvolatile semiconductor memory device according to the present invention can perform the writing operation on a memory cell step by step. Thus, supply of excessive charges to a memory cell by performing the writing operation at a time can be prevented.

A nonvolatile semiconductor memory device according to the present invention includes a semiconductor substrate, a plurality of memory blocks, a plurality of word lines, a plurality of bit lines, and a control circuit. The plurality of memory blocks include a plurality of nonvolatile memory cells arranged in a matrix. The plurality of word lines are arranged in correspondence with a row direction of the plurality of memory cells. The plurality of bit lines are arranged in correspondence with a column direction of the plurality of memory cells. The control circuit performs an erasing operation on the plurality of memory cells at the time of an erasing operation. Each of the plurality of memory cells includes first and second conductive regions and an insulating film. The first and second conductive regions are formed in a main surface of the semiconductor substrate and connected to corresponding bit lines in the plurality of bit lines. The insulating film is formed on the semiconductor substrate between the first and second conductive regions, and has a first storing region in the vicinity of the first conductive region and a second storing region in the vicinity of the second conductive region. The control circuit applies at least one pulse voltages to a selected memory cell in the plurality of memory cells.

With the configuration, the nonvolatile semiconductor memory device according to the present invention can perform the erasing operation on a memory cell step by step.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
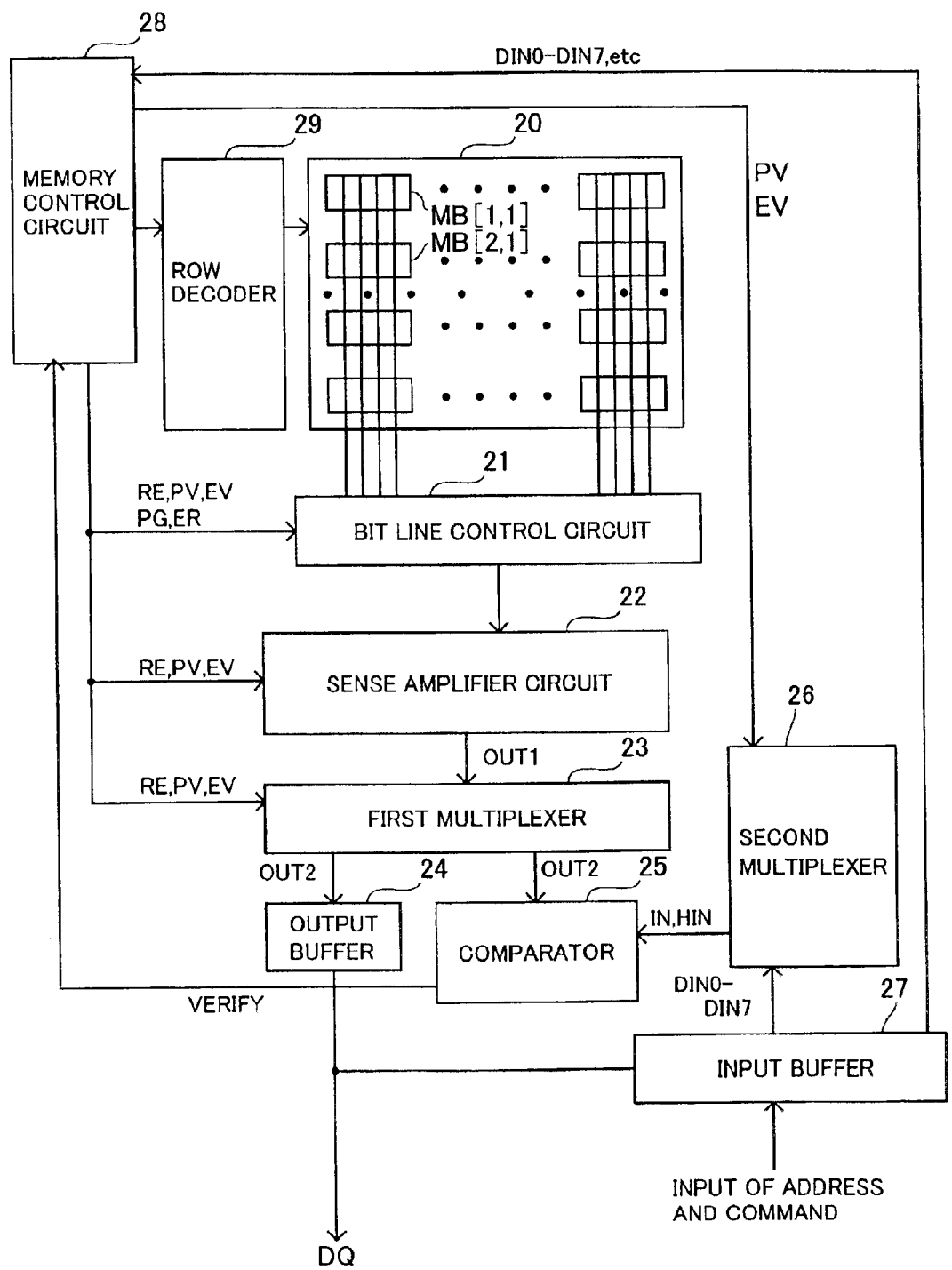
FIG. 1 is a circuit block diagram showing the configuration of a nonvolatile semiconductor memory device in a first embodiment of the present invention.

Embodiments of the present invention will be described in detail hereinafter. The same reference numerals are designated to the same or corresponding parts and the description will not be repeated.

FIG. 1 is a circuit block diagram showing the configuration of a nonvolatile semiconductor memory device in a first embodiment of the present invention.

Referring to FIG. 1, a nonvolatile semiconductor memory device 100 includes a memory cell array 20, a bit line control circuit 21, a sense amplifier circuit 22, a first multiplexer 23, an output buffer 24, a comparator 25, a second multiplexer 26, an input buffer 27, a memory control circuit 28, and a row decoder 29.

Memory cell array 20 includes a plurality of memory blocks MB [m, n]. "m" is a natural number and indicates the row number of a memory block. "n" is a natural number and indicates the column number of a memory block. For example, a memory block MB [8, 64] denotes the memory block positioned in the eighth row and 64th column.

For memory blocks MB [m, n] in the same column, main bit lines MBL (4n−3) to MBL (4n) are disposed. For example, for a plurality of memory blocks MB [m, 1] positioned in the first column, main bit lines MBL1 to MBL4 are disposed.

Figure 2:
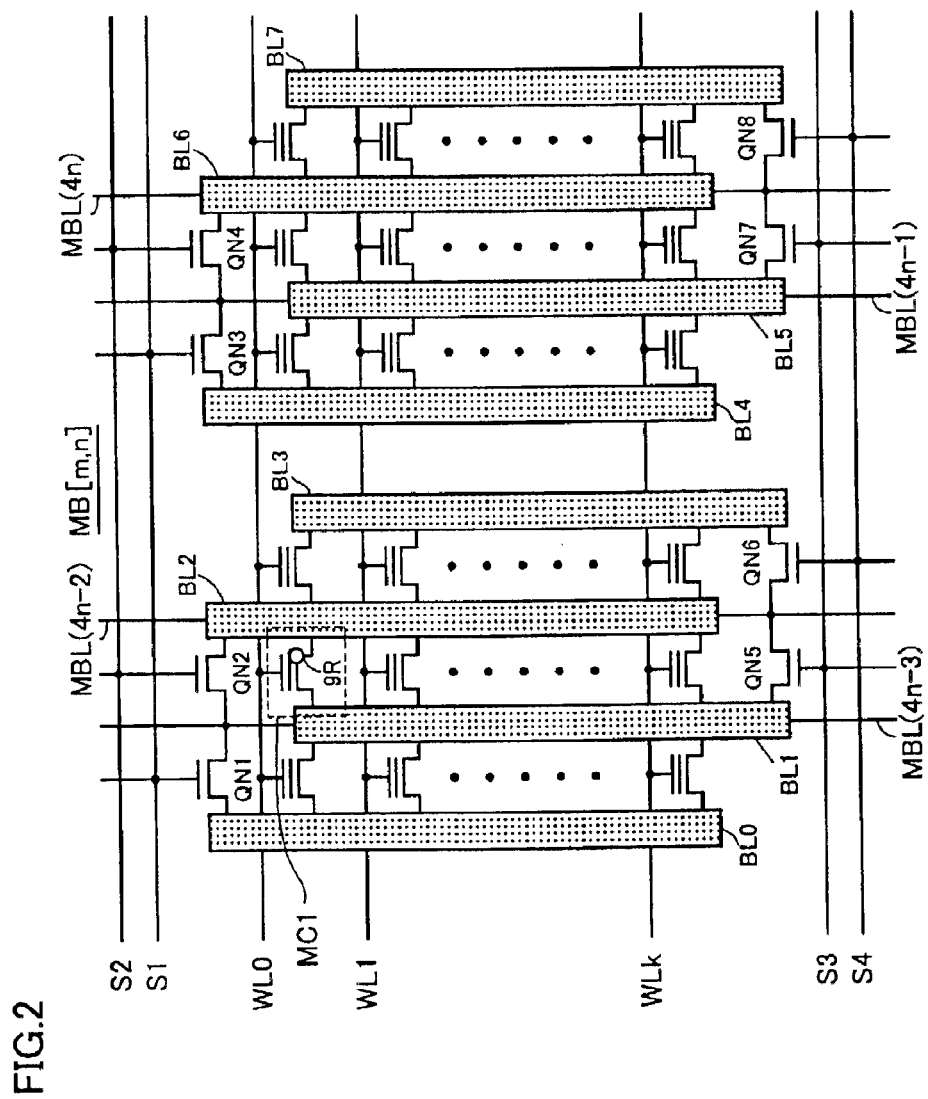
FIG. 2 is a circuit diagram showing the configuration of a memory block in FIG. 1.

FIG. 2 is a circuit diagram showing the configuration of a memory block in FIG. 1.

Memory block MB [m, n] includes a plurality of memory cells MC, a plurality of word lines WLk (k denotes an integer including 0), N-channel MOS transistors QN1 to QN8, signal lines S1 to S4, and diffusion bit lines BL0 to BL7.

Plurality of word lines WLk are arranged in the row direction and diffusion bit lines BL0 to BL7 are arranged in the column direction.

Figure 30:
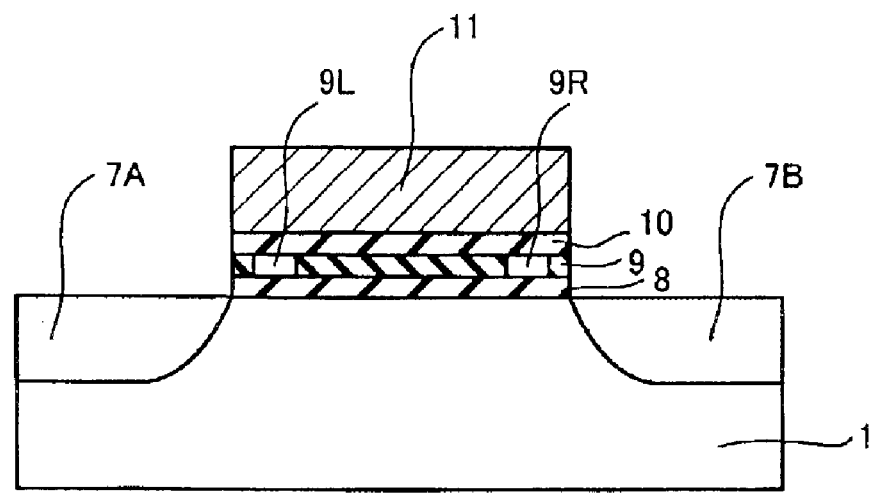
FIG. 30 is a cross sectional view of an NROM.
Figure 31A:
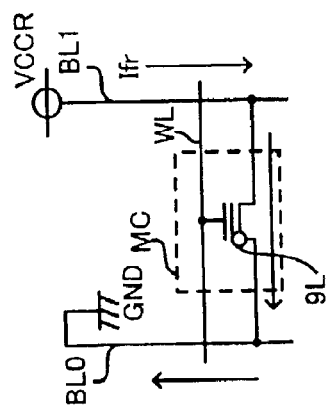
FIGS. 31A to 31D are diagrams showing operations of writing/reading data to/from two storing regions 9L and 9R in an NROM type memory cell.
Figure 31B:
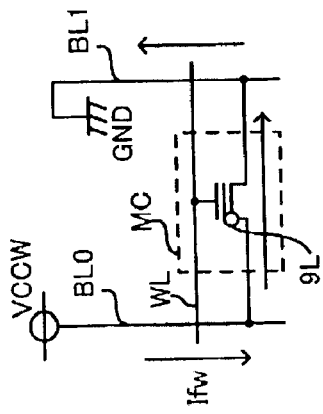
Figure 31C:
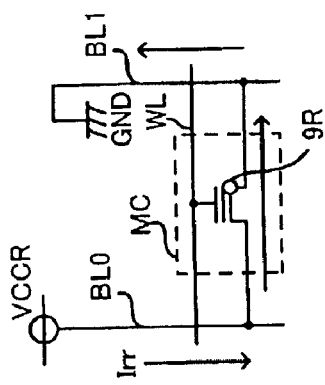
Figure 31D:
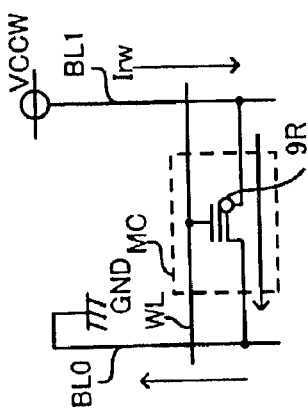
Figure 32A:
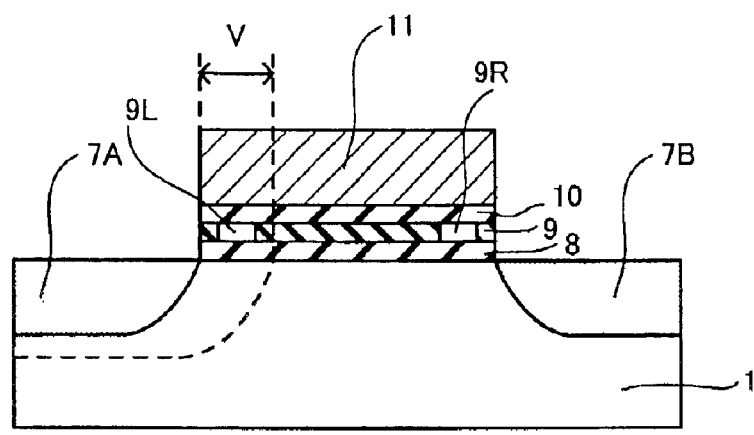
FIGS. 32A and 32B are diagrams for describing a reading operation of an NROM.
Figure 32B:
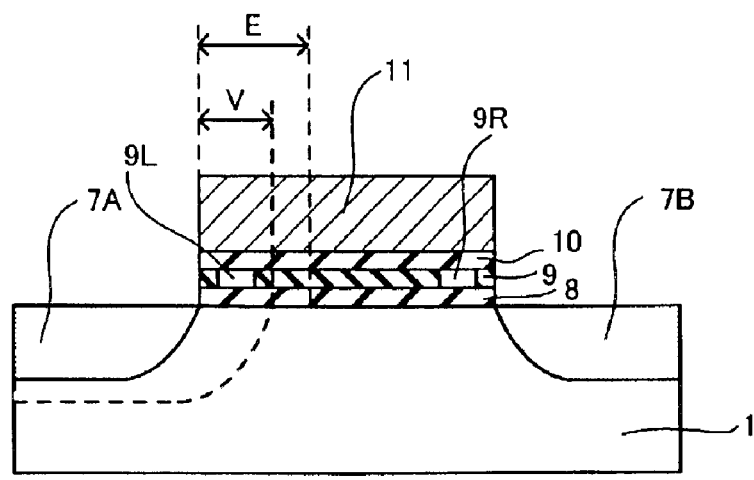
Figure 33:
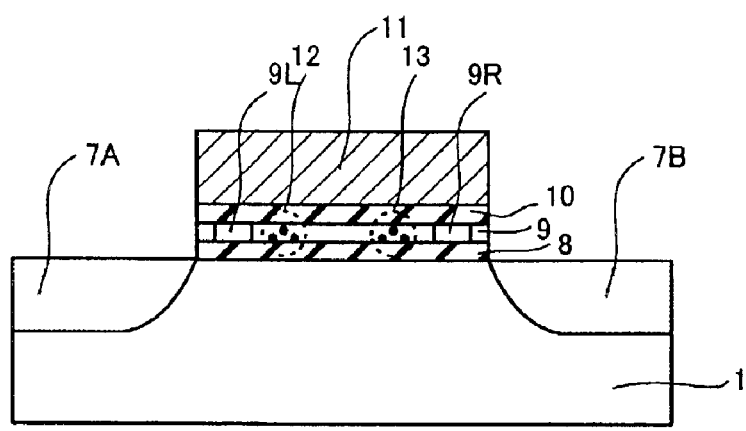
FIG. 33 is a schematic diagram showing a state where electrons are stored in a position apart from each diffusion bit line at the time of a writing operation.

Each of the plurality of memory cells is a nonvolatile memory cell capable of storing binary data which is, for example, an MONOS (Metal-Oxide-Nitride-Oxide-Silicon) type memory cell. The sectional structure of the MONOS type memory cell is as shown in FIG. 30. The plurality of memory cells MC are arranged at intersections of word lines WLk and diffusion bit lines BL0 to BL7. The plurality of memory cells MC disposed in the same row are connected in series, and their gates are connected to the same word line WLk. Each of diffusion bit lines BL0 to BL7 is disposed so as to pass the connection point of adjoining two nonvolatile memory cells MC.

Transistor QN1 is connected between diffusion bit line BL0 and main bit line MBL (4n−3), and its gate is connected to signal line S1. Transistor QN2 is connected between main bit line MBL (4n−3) and diffusion bit line BL2, and its gate is connected to signal line S2. Transistor QN5 is connected between diffusion bit line BL1 and main bit line MBL (4n−2), and its gate is connected to signal line S3. Transistor QN6 is connected between main bit line MBL (4n−2) and diffusion bit line BL3, and its gate is connected to signal line S4. Transistor QN3 is connected between diffusion bit line BL4 and main bit line MBL (4n−1), and its gate is connected to signal line S1. Transistor QN4 is connected between main bit line MBL (4n−1) and diffusion bit line BL6, and its gate is connected to signal line S2. Transistor QN7 is connected between diffusion bit line BL5 and main bit line MBL (4n), and its gate is connected to signal line S3. Transistor QN8 is connected between main bit line MBL (4n) and diffusion bit line BL7, and its gate is connected to signal line S4.

Signal lines S1 to S4 are connected to memory control circuit 28 and transfer signals S1 to S4, respectively.

Referring again to FIG. 1, bit line control circuit 21 is a circuit used for controlling the plurality of main bit lines MBL at the time of outputting/inputting data from/to memory cell array 20.

Figure 3:
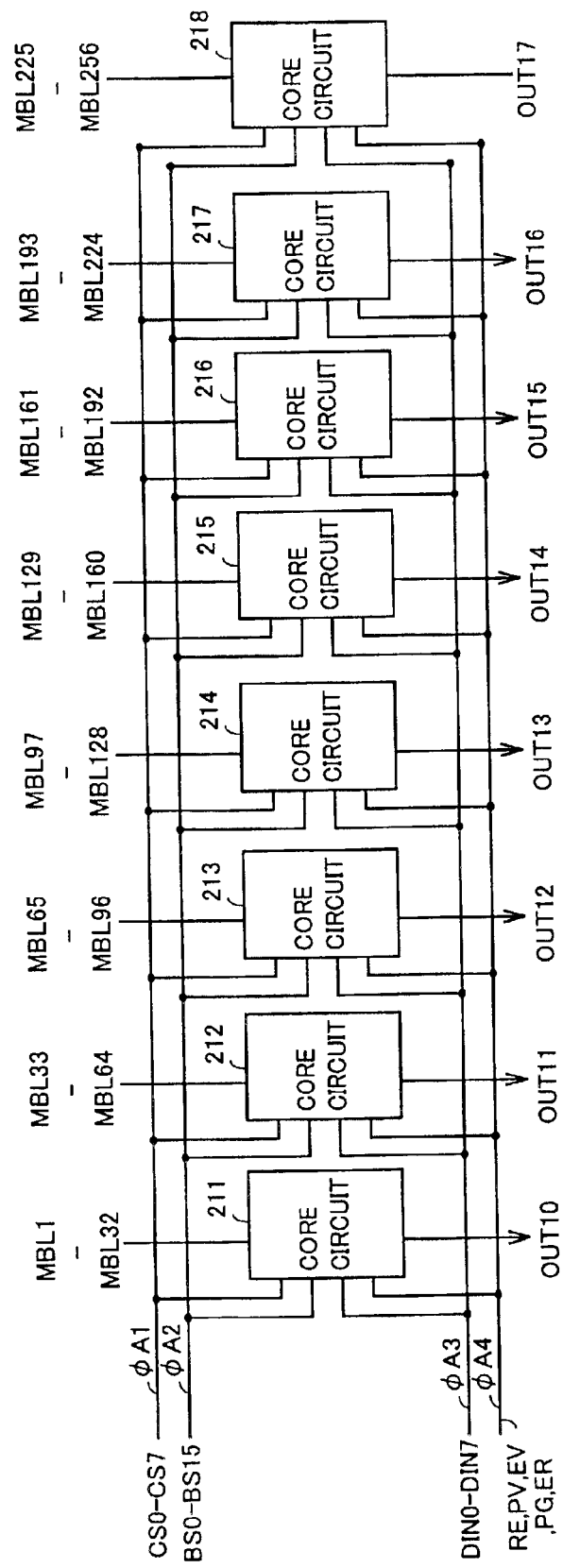
FIG. 3 is a block diagram showing the configuration of a bit line control circuit in FIG. 1.

FIG. 3 is a block diagram showing the configuration of bit line control circuit 21 in FIG. 1. Signals CS0 to CS7, signals BS0 to BS15, and control signals RE, PV, PG, EV, and ER are outputted from memory control circuit 28.

Referring to FIG. 3, bit line control circuit 21 includes eight core circuits 211 to 218. All of core circuits 211 to 218 are connected to signal lines φA1 to φA4. Signal line φA1 transfers signals CS0 to CS7. Signal line φA2 transfers signals BS0 to BS15. Signal line φA3 transfers internal data signals DIN0 to DIN7. Signal line φA4 transfers control signals RE, PV, PG, EV, and ER outputted from memory control circuit 28. Signal PG is a signal which is activated when a write voltage is applied to a memory cell in the writing operation. Signal PV is a signal which is activated when a verifying operation is performed in the writing operation. Signal ER is a signal which is activated in an erasing operation. Signal EV is a signal which is activated at the time of performing the verifying operation in the erasing operation. Control signals PG and PV are outputted from memory control circuit 28 in the writing operation and control signals EV and ER are outputted from memory control circuit 28 in the erasing operation. Control signal RE is a signal which is activated in a reading operation and is outputted from memory control circuit 28.

Each of core circuits 211 to 218 is connected to 32 main bit lines MBL and outputs a signal OUT1 to sense amplifier circuit 22. Signal OUT1 includes signals OUT10 to OUT17. Core circuit 211 is connected to main bit lines MBL1 to MBL32 and outputs signal OUT10 to sense amplifier circuit 22 in response to a signal outputted from memory control circuit 28. Core circuit 212 is connected to main bit lines MBL33 to MBL64 and outputs signal OUT1 to sense amplifier circuit 22. Core circuit 213 is connected to main bit lines MBL65 to MBL96 and outputs signal OUT12 to sense amplifier circuit 22. Core circuit 214 is connected to main bit lines MBL97 to MBL128 and outputs signal OUT13 to sense amplifier circuit 22. Core circuit 215 is connected to main bit lines MBL129 to MBL160 and outputs signal OUT14 to sense amplifier circuit 22. Core circuit 216 is connected to main bit lines MBL161 to MBL192 and outputs signal OUT15 to sense amplifier circuit 22. Core circuit 217 is connected to main bit lines MBL193 to MBL224 and outputs signal OUT16 to sense amplifier circuit 22. Core circuit 218 is connected to main bit lines MBL225 to MBL256 and outputs signal OUT17 to sense amplifier circuit 22.

Figure 4:
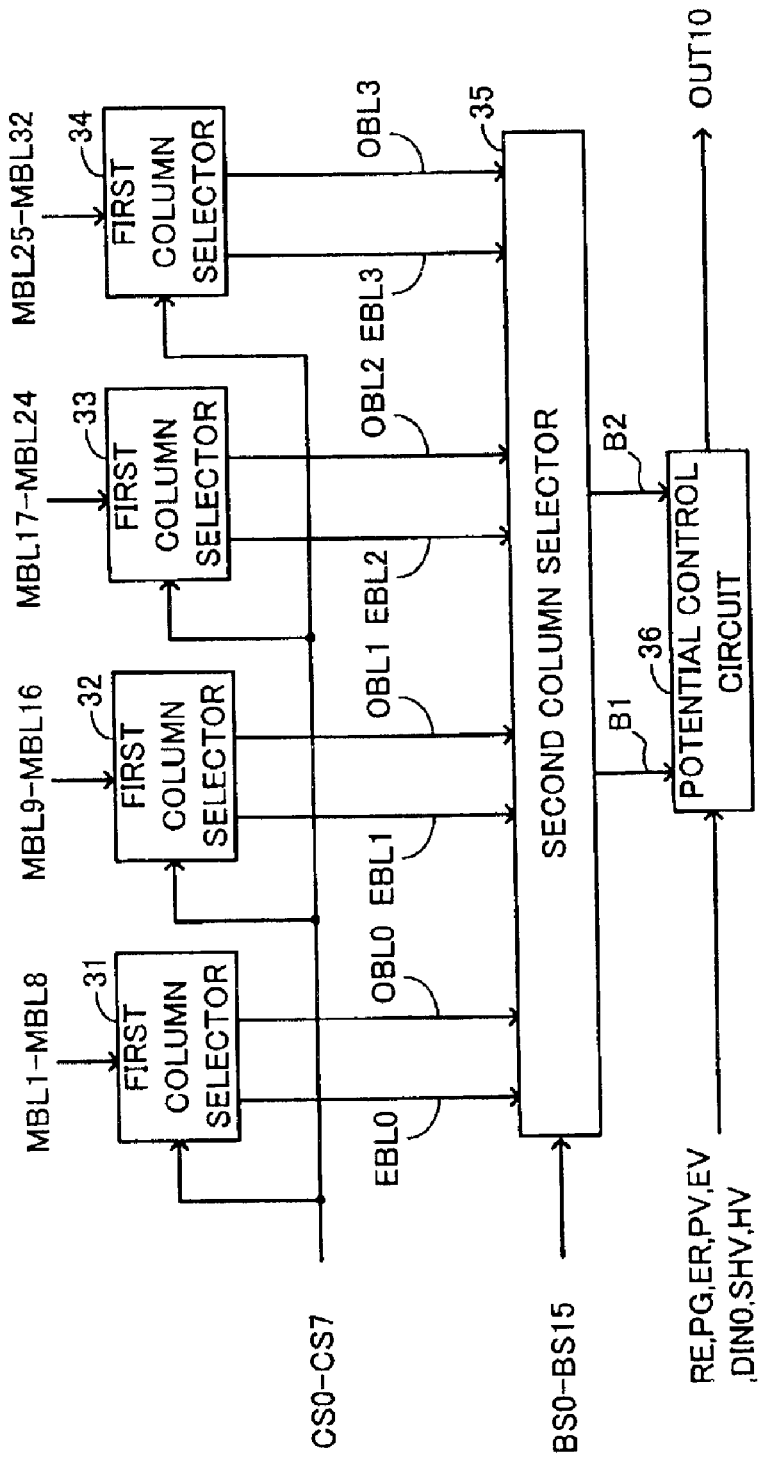
FIG. 4 is a block diagram showing the configuration of a core circuit in FIG. 3.

FIG. 4 is a block diagram showing the configuration of a core circuit in FIG. 3. Although core circuit 211 will be described by referring to FIG. 4, the configuration of the other core circuits 212 to 218 is similar to that of core circuit 211.

Referring to FIG. 4, core circuit 211 includes four first column selectors 31 to 34, a second column selector 35, and a potential control circuit 36.

First column selector 31 is connected to eight main bit lines MBL1 to MBL8, receives signals CS0 to CS7, and outputs signals EBL0 and OBL0. First column selector 32 is connected to eight main bit lines MBL9 to MBL16, receives signals CS0 to CS7, and outputs signals EBL1 and OBL1. First column selector 33 is connected to eight main bit lines MBL17 to MBL24, receives signals CS0 to CS7, and outputs signals EBL2 and OBL2. First column selector 34 is connected to eight main bit lines MBL25 to MBL32, receives signals CS0 to CS7, and outputs signals EBL3 and OBL3.

Second column selector 35 receives signals EBL0 to EBL3 and OBL0 to OBL3 outputted from first column selectors 31 to 34, and outputs signals B1 and B2 in response to signals BS0 to BS15.

Potential control circuit 36 receives signals B1 and B2 outputted from second column selector 35 and outputs signal OUT10 to sense amplifier circuit 22 in response to an instruction of memory control circuit 28.

Since the configuration of each of the other core circuits 212 to 218 is the same as that of core circuit 211, its description will not be repeated.

Figure 5:
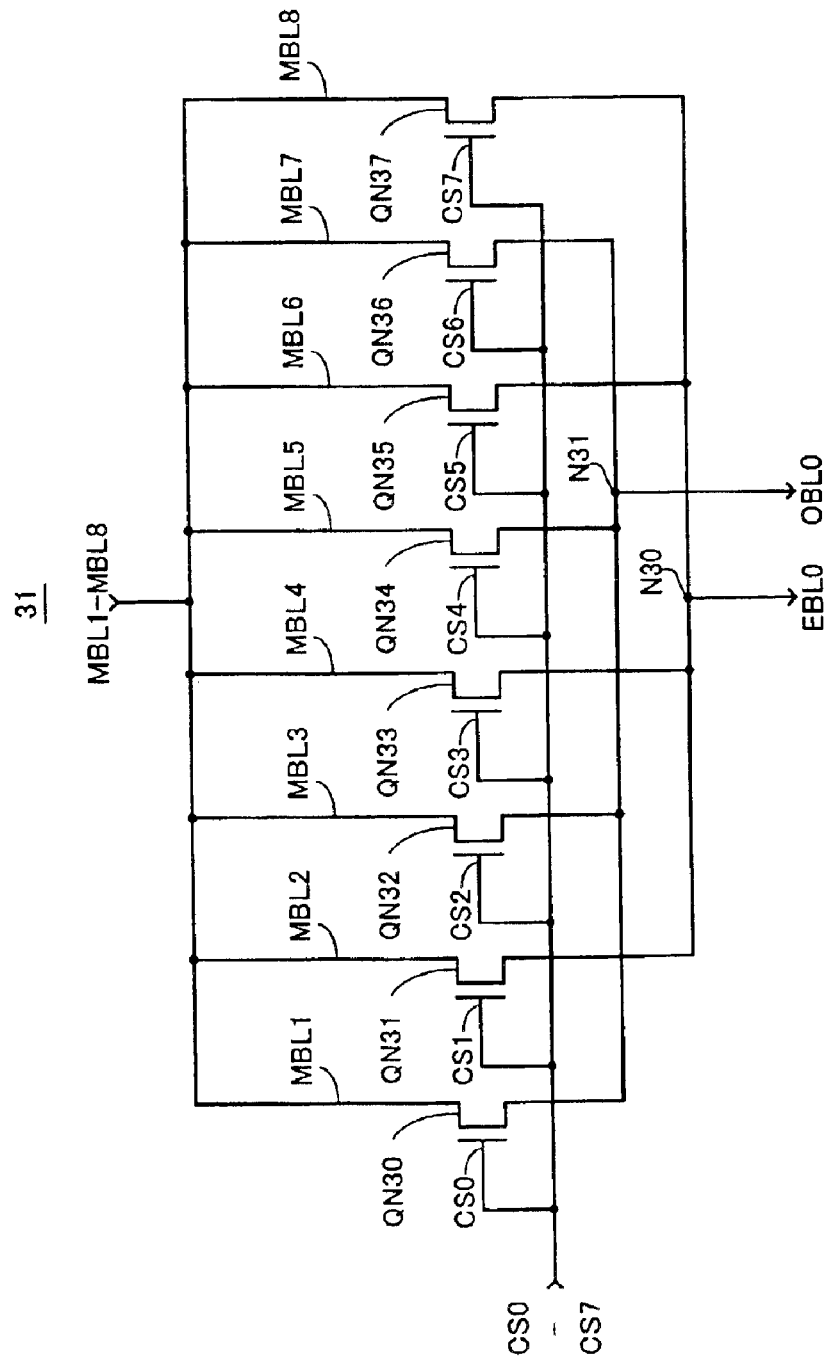
FIG. 5 is a circuit diagram showing the configuration of a first column selector in FIG. 4.

FIG. 5 is a circuit diagram showing the configuration of a first column selector in FIG. 4.

Referring to FIG. 5, first column selector 31 includes a plurality of N-channel MOS transistors QN30 to QN37.

Signal CS0 is inputted to the gate of transistor QN30. Transistor QN30 is connected between main bit line MBL1 and a node N31. Transistor QN31 is connected between main bit line MBL2 and a node N30 and receives signal CS1 by its gate. Transistor QN32 is connected between main bit line MBL3 and node N31 and receives signal CS2 by its gate. Transistor QN33 is connected between main bit line MBL4 and node N30 and receives signal CS3 by its gate. Transistor QN34 is connected between main bit line MBL5 and node N31, and receives signal CS4 by its gate. Transistor QN35 is connected between main bit line MBL6 and node N30 and receives signal CS5 by its gate. Transistor QN36 is connected between main bit line MBL7 and node N31 and receives signal CS6 by its gate. Transistor QN37 is connected between main bit line MBL8 and node N30 and receives signal CS7 by its gate.

In response to signals CS0 to CS7 outputted from memory control circuit 28, first column selector 31 outputs signal EBL0 from node N30 and outputs signal OBL0 from node N31.

Since the configuration of each of the other first column selectors 32 to 34 is the same as that of first column selector 31, its description will not be repeated.

Figure 6:
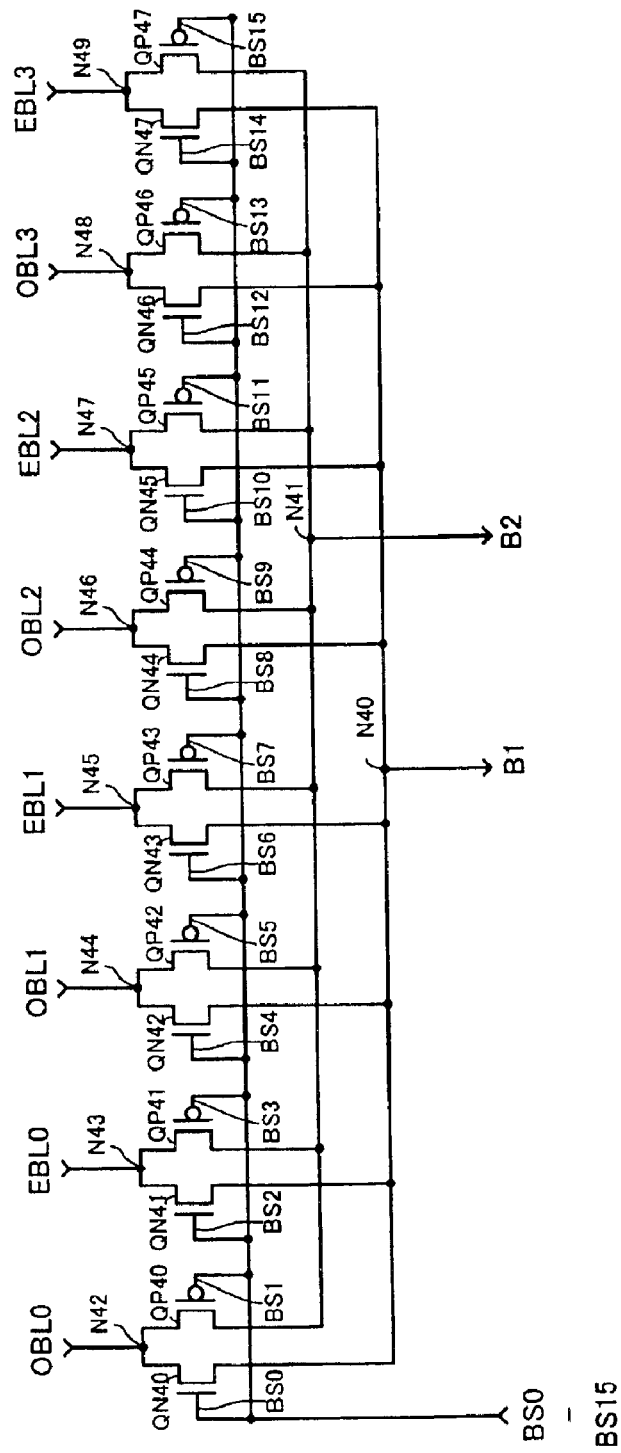
FIG. 6 is a circuit diagram showing the configuration of a second column selector in FIG. 4.

FIG. 6 is a circuit diagram showing the configuration of a second column selector in FIG. 4.

Referring to FIG. 6, second column selector 35 includes a plurality of N-channel MOS transistors QN40 to QN47 and P-channel MOS transistors QP40 to QP47. Transistor QN40 is connected between nodes N42 and N40 and receives signal BS0 by its gate. Transistor QP40 is connected between nodes N42 and N41 and receives signal BS1 by its gate. Node N42 receives signal OBL0 outputted from first column selector 31. Transistor QN41 is connected between nodes N43 and N40, and receives signal BS2 by its gate. Transistor QP41 is connected between nodes N43 and N41 and receives signal BS3 by its gate. Node N43 receives signal EBL0 outputted from first column selector 31. Transistor QN42 is connected between nodes N44 and N40 and receives signal BS4 by its gate. Transistor QP42 is connected between nodes N44 and N41, and receives signal BS5 by its gate. Node N44 receives signal OBL1 outputted from first column selector 32. Transistor QN43 is connected between nodes N45 and N40, and receives signal BS6 by its gate. Transistor QP43 is connected between nodes N45 and N41, and receives signal BS7 by its gate. Node N45 receives signal EBL1 outputted from first column selector 32. Transistor QN44 is connected between nodes N46 and N40, and receives signal BS8 by its gate. Transistor QP44 is connected between nodes N46 and N41 and receives signal BS9 by its gate. Node N46 receives signal OBL2 outputted from first column selector 33. Transistor QN45 is connected between nodes N47 and N40, and receives signal BS10 by its gate. Transistor QP45 is connected between nodes N47 and N41 and receives signal BS11 by its gate. Node N47 receives signal EBL2 outputted from first column selector 33. Transistor QN46 is connected between nodes N48 and N40, and receives signal BS12 by its gate. Transistor QP46 is connected between nodes N48 and N41, and receives signal BS13 by its gate. Node N48 receives signal OBL3 outputted from first column selector 34. Transistor QN47 is connected between nodes N49 and N40 and receives signal BS14 by its gate. Transistor QP47 is connected between nodes N49 and N41 and receives signal BS15 by its gate. Node N49 receives signal EBL3 outputted from first column selector 34.

In response to signals BS0 to BS15 outputted from memory control circuit 28, second column selector 35 outputs signal B1 from node N40 and outputs signal B2 from node N41.

Figure 7:
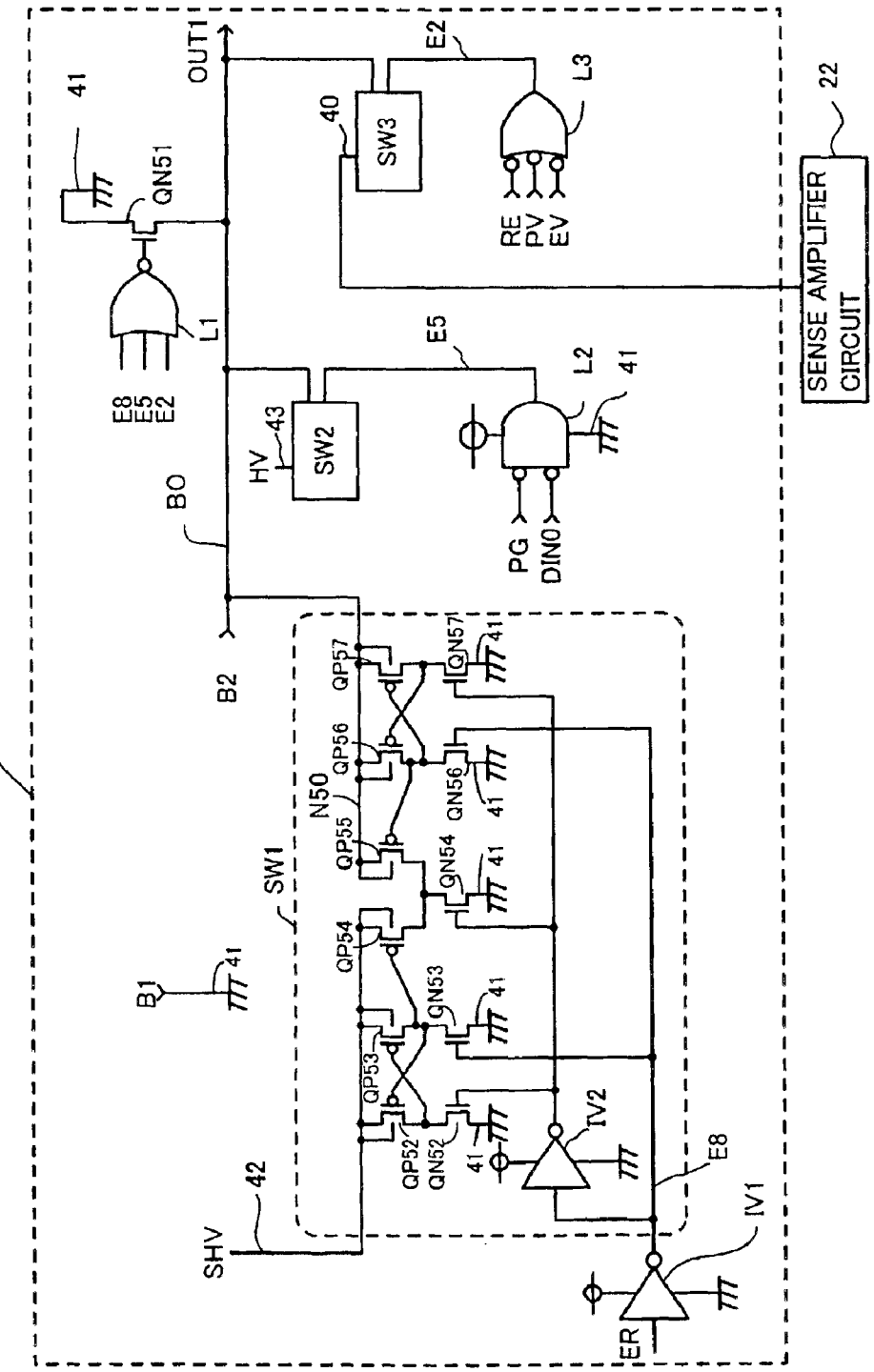
FIG. 7 is a circuit diagram showing the configuration of a potential control circuit in FIG. 4.

FIG. 7 is a circuit diagram showing the configuration of potential control circuit 36 in FIG. 4.

Referring to FIG. 7, potential control circuit 36 includes switch circuits SW1 to SW3, an inverter IV1, logic gates L1 to L3, and an N-channel MOS transistor QN51.

A signal line B0 is connected to a potential SHV node 42 via switch circuit SW1, connected to a potential HV node 43 via switch circuit SW2, and connected to a power supply potential node 40 for outputting a potential of about 2V via switch circuit SW3. Signal line B0 receives signal B2 outputted from second column selector 35 and outputs it as signal OUT1.

Inverter IV1 receives signal ER outputted from memory control circuit 28, inverts signal ER, and outputs the result as a signal E8. Logic gate L2 receives signal PG outputted from memory control circuit 28 and internal data signal DIN0, and outputs a result of NOR operation as a signal E5.

Logic gate L3 receives signals RE, PV, and EV outputted from memory control circuit 28. When all of input signals RE, PV, and EV are at the H level, logic gate L3 outputs a signal E2 of the L level. In the other cases, logic gate L3 outputs signal E2 of the H level.

Transistor QN51 is connected between signal line B0 and ground potential node 41, and receives an output signal from logic gate L1 by its gate. Logic gate L1 receives signals E8, E5, and E2 and, when all of signals E8, E5, and E2 are at the L level, outputs the H-level signal. When the signal outputted from logic gate L1 is at the H level, transistor QN51 is turned on and the potential on signal line B0 is maintained at the ground potential.

Switch circuit SW1 includes a plurality of N-channel MOS transistors QN52 to QN54, QN56, and QN57, P-channel MOS transistors QP52 to QP57, and an inverter IV2. Inverter IV2 receives signal E8, inverts it, and outputs the resultant signal.

Transistors QP52 and QN52 are connected in series between potential SHV node 42 and ground potential node 41. Transistors QP53 and QN53 are connected in series between potential SHV node 42 and ground potential node 41. The gate of transistor QP52 is connected to the drain of transistor QN53. The gate of transistor QP53 is connected to the drain of transistor QN52. The gate of transistor QN52 receives an output signal of inverter IV2, and the gate of transistor QN53 receives signal E8. Transistors QP54 and QN54 are connected in series between potential SHV node 42 and ground potential node 41. The gate of transistor QP54 is connected to the drain of transistor QN53. The gate of transistor QN54 receives an output signal of inverter IV2.

Transistors QP55 and QN54 are connected in series between a node N50 and ground potential node 41. Transistors QP56 and QN56 are connected in series between node N50 and ground potential node 41. Transistors QP57 and QN57 are connected in series between node N50 and ground potential node 41.

The gate of transistor QP55 is connected to the drain of transistor QN56. The gate of transistor QP56 is connected to the drain of transistor QN57. The gate of transistor QP57 is connected to the drain of transistor QN56. The gate of transistor QN56 receives signal E8. The gate of transistor QN57 receives an output signal of inverter IV2.

The operation of switch circuit SW1 will now be described.

When signal ER outputted from memory control circuit 28 is at the H level, transistor QP53 in switch circuit SW1 is turned on and transistors QP52 and QP54 are turned off. Transistor QP56 is turned on and transistors QP55 and QP57 are turned off. As a result, potential SHV node 42 and signal line B0 are disconnected from each other. Therefore, when signal ER is at the H level, switch circuit SW1 is turned off.

On the other hand, when signal ER is at the L level, transistors QP52 and QP54 in switch circuit SW1 are turned on, and transistor QP53 is turned off. Transistors QP55 and QP57 are turned on and transistor QP56 is turned off. As a result, switch circuit SW1 is turned on to connect potential SHV node 42 to signal line B0.

Since each of the other switch circuits SW2 and SW3 has the same configuration as that of switch circuit SW1, its description will not be repeated. When signal E5 outputted from logic gate L2 is at the H level, switch circuit SW2 is turned on. As a result, switch circuit SW2 connects potential HV node 43 to signal line B0. When signal E2 outputted from logic gate L3 is at the H level, switch circuit SW3 is turned on. As a result, switch circuit SW3 connects sense amplifier circuit 22 to signal line B0.

Node N40 of second column selector 35 is connected to ground potential node N41.

Figure 8:
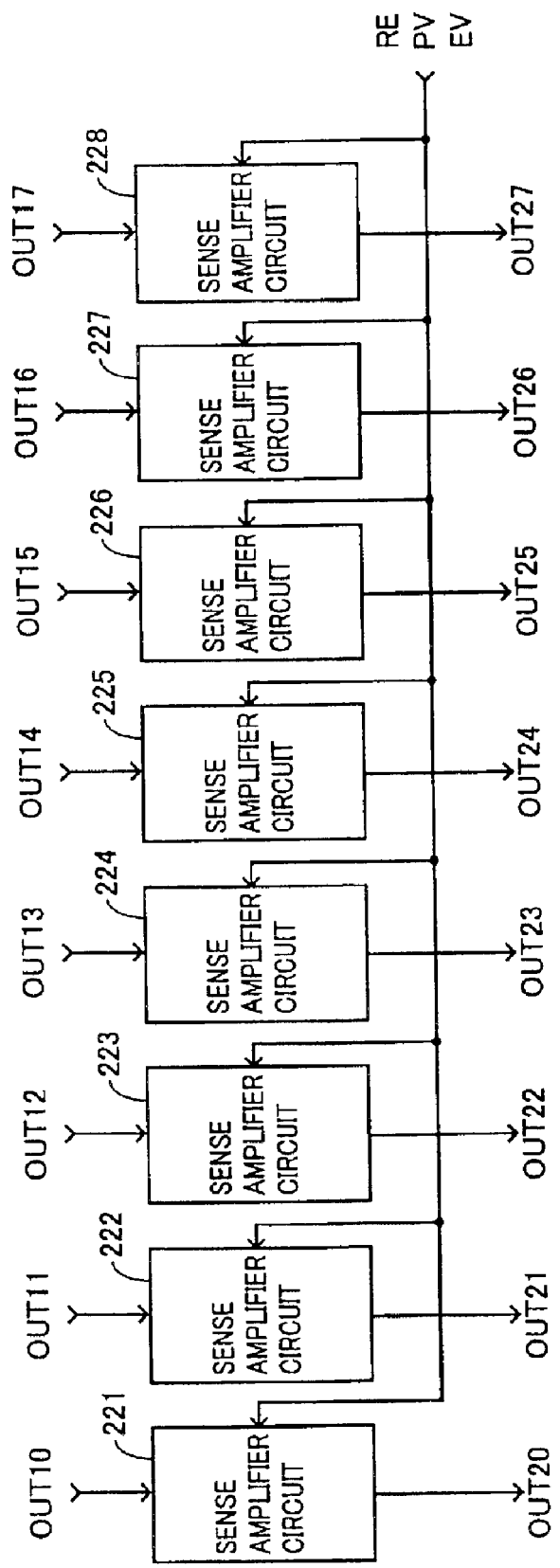
FIG. 8 is a block diagram showing the configuration of a sense amplifier circuit in FIG. 1.

FIG. 8 is a block diagram showing the configuration of sense amplifier circuit 22 in FIG. 1.

Referring to FIG. 8, sense amplifier 22 includes a plurality of sense amplifiers 221 to 228.

Sense amplifier 221 receives signal OUT10 outputted from bit line control circuit 21 and signals RE, PV, and EV outputted from memory control circuit 28, and outputs a signal OUT20 to first multiplexer 23. Similarly, sense amplifier 222 receives signal OUT11 and signals RE, PV, and EV, and outputs a signal OUT21. Sense amplifier 223 receives signal OUT12 and signals RE, PV, and EV, and outputs a signal OUT22. Sense amplifier 224 receives signal OUT13 and signals RE, PV, and EV, and outputs a signal OUT23. Sense amplifier 225 receives signal OUT14 and signals RE, PV, and EV, and outputs a signal OUT24. Sense amplifier 226 receives signal OUT15 and signals RE, PV, and EV, and outputs a signal OUT25. Sense amplifier 227 receives signal OUT16 and signals RE, PV, and EV, and outputs a signal OUT26. Sense amplifier 228 receives signal OUT17 and signals RE, PV, and EV and outputs a signal OUT27.

Figure 9:
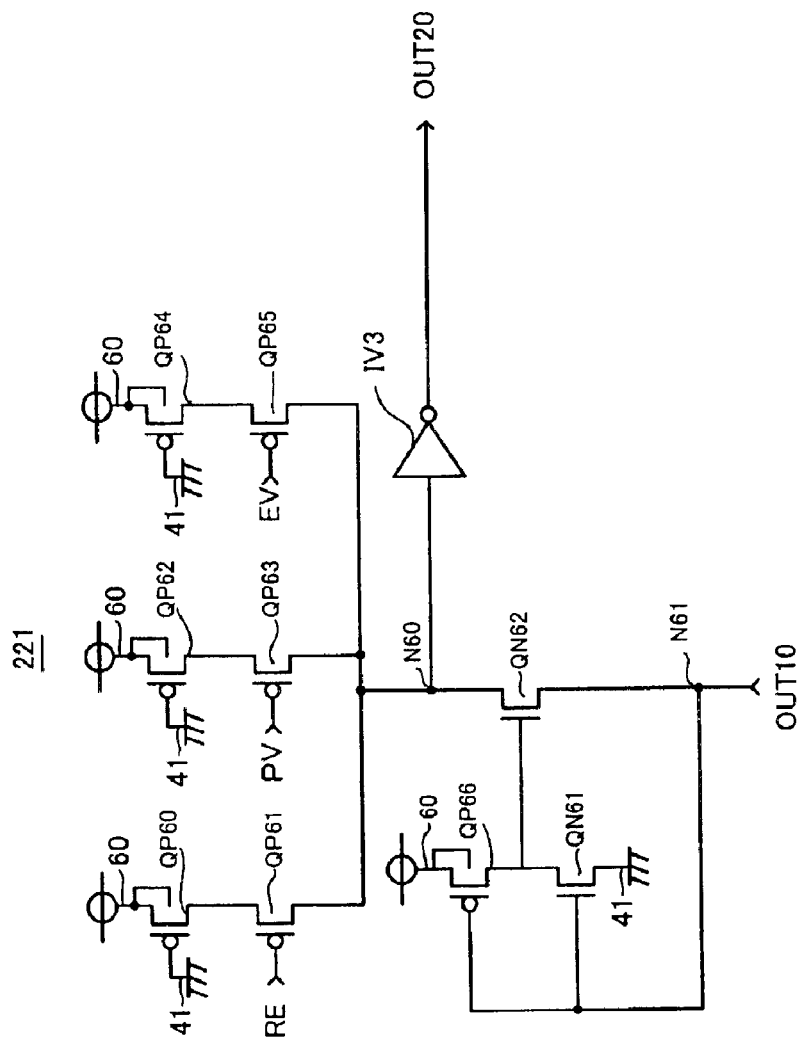
FIG. 9 is a circuit diagram showing the configuration of a sense amplifier in FIG. 8.

FIG. 9 is a circuit diagram showing the configuration of a sense amplifier in FIG. 8.

Referring to FIG. 9, sense amplifier 221 includes P-channel MOS transistors QP60 to QP66, N-channel MOS transistors QN61 and QN62, and an inverter IV3.

Transistors QP60 and QP61 are connected in series between a power supply potential node 60 and a node N60. The gate of transistor QP60 is connected to ground potential node 41. Signal RE is inputted to the gate of transistor QP61. Transistors QP62 and QP63 are connected in series between power supply potential node 60 and node N60. The gate of transistor QP62 is connected to ground potential node 41, and signal PV is inputted to the gate of transistor QP63. Transistors QP64 and QP65 are connected in series between power supply potential node 60 and node N60. The gate of transistor QP64 is connected to ground potential node 41. Signal EV is inputted to the gate of transistor QP65.

Transistor QN62 is connected between nodes N60 and N61. Transistors QP66 and QN61 are connected in series between power supply potential node 60 and ground potential node 41. The gate of transistor QP66 and the gate of transistor QN61 are connected to node N61. The gate of transistor QN62 is connected to the drain of transistor QN61. Signal OUT10 is inputted to node N61.

An input terminal of inverter IV3 is connected to node N60. Inverter IV3 receives a signal outputted from node N60, inverts it, and outputs the inverted signal as signal OUT20.

As described above, sense amplifier 221 makes the form of a single-end sense amplifier.

The operation of sense amplifier 221 will now be described.

With respect to the current driving force of each of transistors QP60, QP62, and QP64 in sense amplifier 221, the current driving force of QP64 is the strongest, that of QP60 is the second strongest, and that of QP62 is the weakest.

In a normal reading operation, signal RE is activated (to the L level) and the other signals PV and EV maintain an inactive state. As a result, in response to the current driving force of transistor QP60, the sensitivity of the sense amplifier is determined. In a verifying operation in the writing operation, signal PV is made active (L level) and the other signals RE and EV maintain the inactive state. As a result, transistor QP62 of which current driving force is small is connected to node N60, and the potential on node N60 decreases even when a pull-out current by a memory cell via transistor QN62 is very low. Therefore, the potential on node N60 does not become equal to or smaller than a logic threshold value of inverter IV3. In other words, if the threshold value of the memory cell is not sufficiently high and the pull-out current by the memory cell via transistor QN62 is not sufficiently suppressed, sense amplifier 221 does not recognizes the state as a "programmed state". Therefore, in the writing operation, only in the case where data is written with reliability, sense amplifier 221 outputs signal OUT20 of the L level.

In the verifying operation during the erasing operation, signal EV becomes active (L level), and the other signals RE and PV maintain the inactive state (H level). As a result, transistor QP64 having a large current driving force is connected to node N60. Therefore, the potential of node N60 does not decreases even if the pull-out current by the memory cell via transistor QN62 is rather large, and does not becomes equal to or lower than the logic threshold value of inverter IV3. That is, if the threshold value of the memory cell is not sufficiently low and the pull-out current by the memory cell via transistor QN62 is not sufficiently obtained, the state is not regarded as an "erase state". As a result, in the erasing operation, only in the case where data is erased with reliability, sense amplifier 221 outputs signal OUT20 of the H level.

As described above, by changing the sensitivity of the sense amplifier between the verifying operation in the writing operation and that in the erasing operation, reliability of the sense amplifier can be increased.

Although sense amplifier 221 has been described by referring to FIG. 9, since the configuration of each of the other sense amplifiers 222 to 228 is the same as that of sense amplifier 221, its description will not be repeated.

In FIG. 9, the sense amplifier is of the single end type. However, sense amplifier of other configurations may be also employed.

Figure 10:
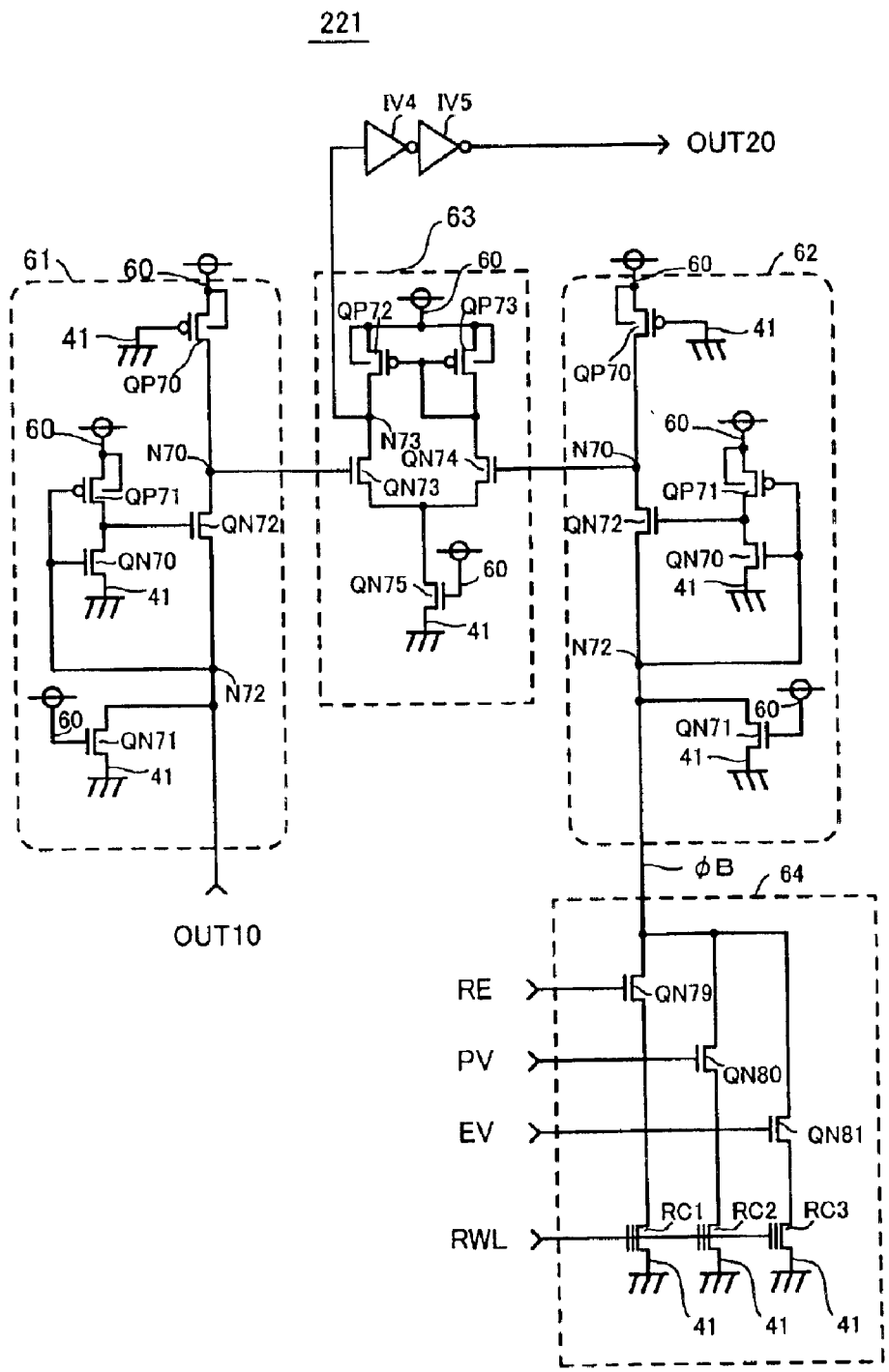
FIG. 10 is a circuit diagram showing another configuration of the sense amplifier in FIG. 8.

FIG. 10 is a circuit diagram showing the other configuration of the sense amplifier in FIG. 8.

Referring to FIG. 10, sense amplifier 221 includes sense circuits 61 and 62, a differential amplifier 63, and a reference potential generating circuit 64.

Sense circuit 61 includes P-channel MOS transistors QP70 and QP71 and N-channel MOS transistors QN70 to QN72.

Transistors QP70 and QN72 are connected in series between power supply potential node 60 and node N72. The gate of transistor QP70 is connected to ground potential node 41. Transistors QP71 and QN70 are connected in series between power supply potential node 60 and ground potential node 41. Both the gate of transistor QP71 and the gate of transistor QN70 are connected to a node N72. The gate of transistor QN72 is connected to the drain of transistor QN70. Sense circuit 61 receives signal OUT10 by node N72, and outputs a signal from node N70 as a connection point of transistors QP70 and QN72.

Transistor QN71 is connected between node N72 and ground potential node 41, and its gate is connected to power supply potential node 60. Since the gate length of transistor QN71 is long, only a very small current flows. As a result, transistor QN71 has the role of adjusting the operation point of node N70.

Since the configuration of sense circuit 62 is similar to that of sense circuit 61 except that sense circuit 62 receives a signal $\phi B$ outputted from reference potential generating circuit 64 in place of signal OUT10, its description will not be repeated.

Differential amplifier 63 includes P-channel MOS transistors QP72 and QP73 and N-channel MOS transistors QN73 to QN75.

Transistors QP72, QN73, and QN75 are connected in series between power supply potential node 60 and ground potential node 41. Transistors QP73 and QN74 are connected in series between power supply potential node 60 and the drain of transistor QN75. The gate of transistor QP72 is connected to the gate of transistor QP73. The gate of transistor QP73 is diode-connected. Therefore, transistors QP72 and QP73 construct a current mirror. The gate of transistor QN73 receives an output signal of sense circuit 61. The gate of transistor QN74 receives an output signal of sense circuit 62. The gate of transistor QN75 is connected to power supply potential node 60. Transistor QN75 functions as a constant current source. Differential amplifier 63 compares an output signal of sense circuit 61 with an output signal of sense circuit 62, and outputs the result from a node N73 as a connection point of transistors QP72 and QN73. An inverter IV4 receives an output signal of differential amplifier 63, inverts it, and outputs the inverted signal. An inverter IV5 receives an output signal of inverter IV4, inverts it, and outputs the inverted signal as signal OUT20.

Reference potential generating circuit 64 includes transistors QN79 to QN81 and reference cells RC1 to RC3.

Transistor QN79 and reference cell RC1 are connected in series between node N72 in sense circuit 62 and ground potential node 41. Transistor QN80 and reference cell RC2 are connected in series between node N72 in sense circuit 62 and ground potential node 41. Further, transistor QN81 and reference cell RC3 are connected in series between node N72 in sense circuit 62 and ground potential node 41. Signal RE is inputted to the gate of transistor QN79. Signal PV is inputted to the gate of transistor QN80. Signal EV is inputted to the gate of transistor QN81.

Reference cells RC1 to RC3 have the same structure, material, and size as those of normal memory cells. To the gates of reference cells RC1 to RC3, a reference word line RWL is commonly connected.

The threshold value of reference cell RC2 is set to be larger than that of reference cell RC1, and the threshold value of reference cell RC3 is set to be smaller than that of reference cell RC1. For example, when the threshold value of reference cell RC1 is set to 2.5V, the threshold value of reference cell RC2 is set to 3.5V, and the threshold value of reference cell RC3 is set to 1.5V.

As a result, the potential of an output signal of sense circuit 62 at the time of verification in the writing operation is the highest, and that at the time of verification in the erasing operation is the lowest. Therefore, in the writing operation, only in the case where data is written with reliability, signal OUT20 becomes L level. In the erasing operation, only when data is erased with reliability, signal OUT20 becomes H level.

Consequently, by changing the sensitivity of sense amplifier 221 between the writing operation and the erasing operation, the writing and erasing states can be checked more reliably.

Although the configuration of sense amplifier 221 has been described by referring to FIG. 10, as the configuration of each of the other sense amplifiers 222 to 228 is the same as that of sense amplifier 221, its description will not be repeated.

Figure 11:
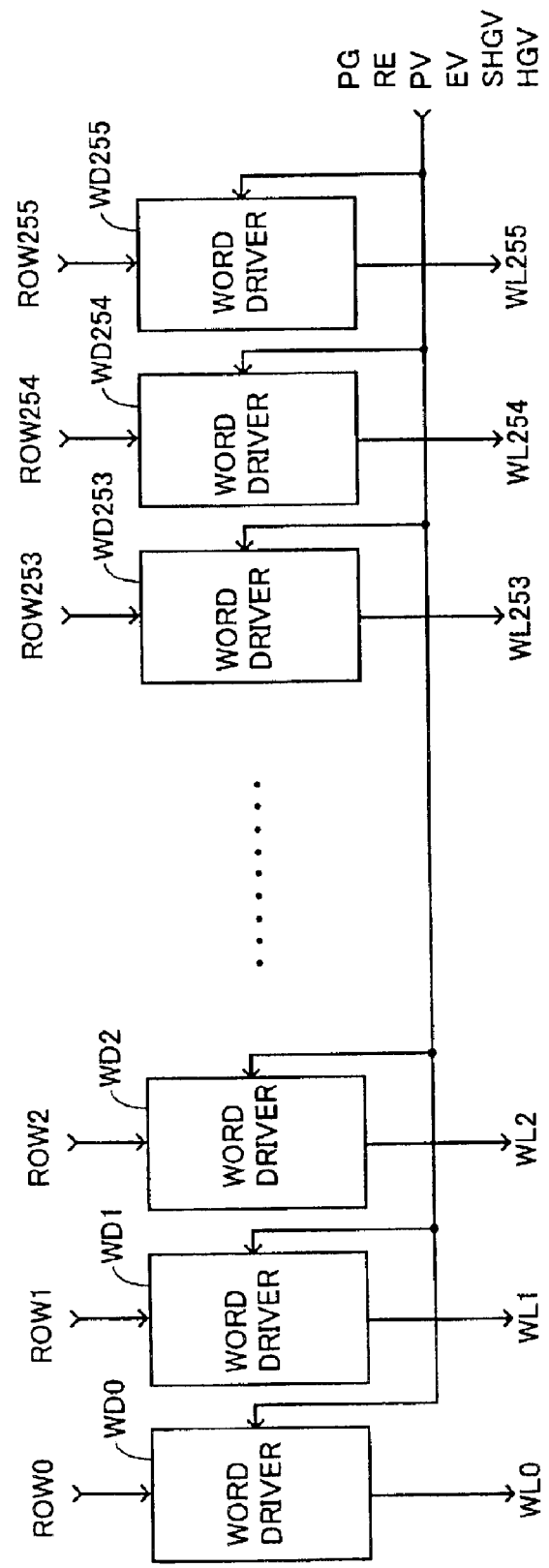
FIG. 11 is a block diagram showing the configuration of a row decoder in FIG. 1.

FIG. 11 is a block diagram showing the configuration of row decoder 29 in FIG. 1.

Referring to FIG. 11, row decoder 29 includes a plurality of word drivers WD0 to WD255. Word driver WDq (q denotes an integer from 0 to 255) receives a signal ROWq outputted from memory control circuit 28 and signals PG, RE, PV, EV, SHGV, and HGV, and outputs an activated signal to a word line WLq.

Figure 12:
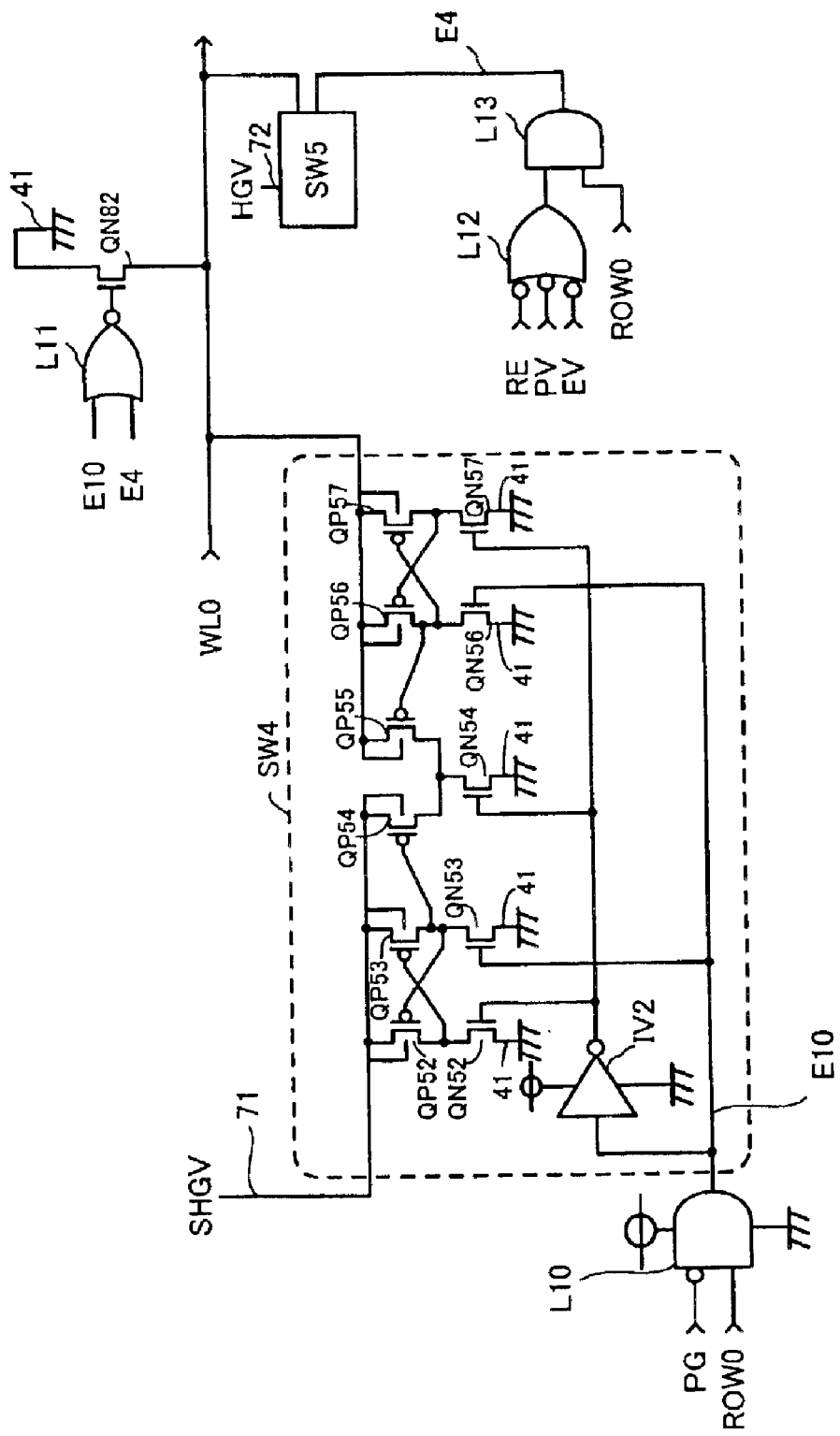
FIG. 12 is a circuit diagram showing the configuration of a word driver in FIG. 11.

FIG. 12 is a circuit diagram showing the configuration of a word driver in FIG. 11.

Referring to FIG. 12, word driver WD0 includes logic gates L10 to L13, switch circuits SW4 and SW5, and an N-channel MOS transistor QN82.

Word line WL0 is connected to a potential SHGV node 71 via switch circuit SW4, and is connected to a potential HGV node 72 via switch circuit SW5. Since the configuration of each of switch circuits SW4 and SW5 is the same as that of switch circuit SW1 shown in FIG. 7, its description will not be repeated.

Logic gate L10 receives signals PG and ROW0 and outputs a result of AND logic operation of an inversion signal of signal PG and signal ROW0 as a signal E10. When signal E10 is at the L level, switch circuit SW4 is turned off, so that word line WL0 and potential SHGV node 71 are disconnected from each other. On the other hand, when signal E10 is at the H level, switch circuit SW4 is turned on. Therefore, the potential of word line WL0 is maintained at a potential SHGV.

Logic gate L12 receives signals RE, PV, and EV. When all of signals RE, PV, and EV are at the H level, logic gate L12 outputs a signal of the L level. When even one of signals RE, PV, and EV is at the L level, logic gate L12 outputs a signal of the H level. Logic gate L13 receives an output signal of logic gate L12 and signal ROW0, and outputs a result of the AND logic operation as a signal E4.

When signal E4 is at the L level, switch circuit SW5 is turned off. Therefore, at this time, potential HGV node 72 and word line WL0 are disconnected from each other. On the other hand, when signal E4 is at the H level, switch circuit SW5 is turned on. Therefore, potential HGV node 72 and word line WL0 are connected to each other, and the potential of word line WL0 is maintained at potential HGV.

Figure 13:
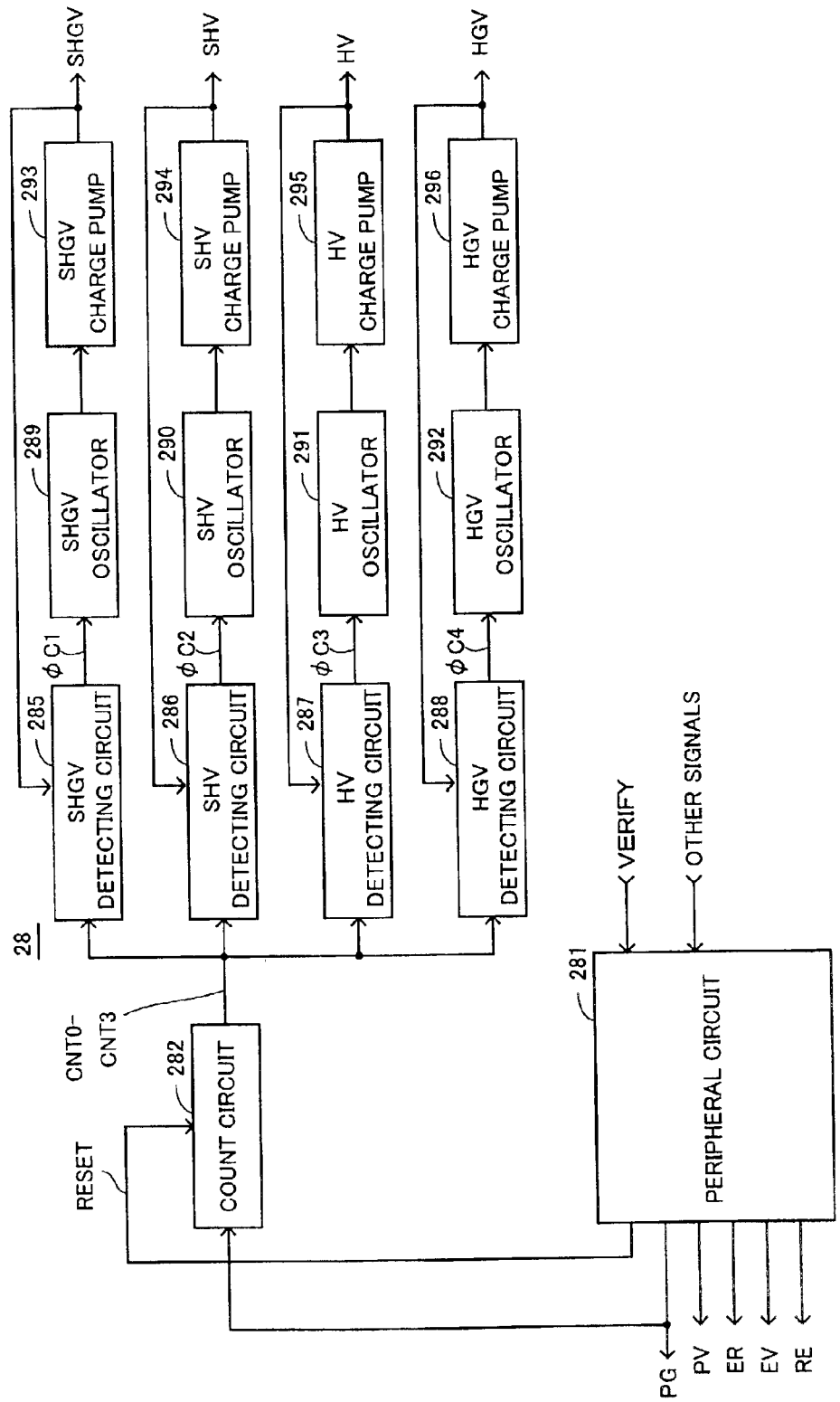
FIG. 13 is a block diagram showing the configuration of a memory control circuit in FIG. 1.

FIG. 13 is a block diagram showing the configuration of a memory control circuit in FIG. 1.

Referring to FIG. 13, memory control circuit 28 includes a peripheral circuit 281, a count circuit 282, an SHGV detecting circuit 285, an SHV detecting circuit 286, an HV detecting circuit 287, an HGV detecting circuit 288, an SHGV oscillator 289, an SHV oscillator 290, an HV oscillator 291, an HGV oscillator 292, an SHGV charge pump 293, an SHV charge pump 294, an HV charge pump 295, and an HGV charge pump 296.

Peripheral circuit 281 controls the whole semiconductor memory device 100. Peripheral circuit 281 outputs signals PG and PV at the time of a writing operation, and outputs signals ER and EV at the time of an erasing operation. Peripheral circuit 281 receives a signal VERIFY outputted from comparator 25.

Count circuit 282 is a 4-bit counter. Each time signal PG is outputted from peripheral circuit 281, count circuit 282 increments the count value by one, and outputs count signals CNT0 to CNT3.

SHGV detecting circuit 285, SHGV oscillator 289, and SHGV charge pump 293 construct a booster circuit.

SHGV detecting circuit 285 receives a signal SHGV outputted from SHGV charge pump 293 and detects whether the potential of signal SHGV reaches a predetermined potential or not. If the potential of received signal SHGV has not reached the predetermined potential, SHGV detecting circuit 285 outputs a signal φC1 of the H level to SHGV oscillator 289. If the potential of received signal SHGV has reached the predetermined potential, SHGV detecting circuit 285 outputs signal φC1 of the L level to SHGV oscillator 289.

When signal φC1 is at the H level, SHGV oscillator 289 outputs a clock signal to boost SHGV charge pump 293. When signal φC1 is at the L level, SHGV oscillator 289 stops its operation.

In the writing operation, SHGV charge pump 293 outputs signal SHGV having the potential boosted in response to the clock signal outputted from SHGV oscillator 289. Signal SHGV has a gate potential in the writing operation.

SHV detecting circuit 286, SHV oscillator 290, and SHV charge pump 294 construct a booster circuit.

SHV detecting circuit 286 receives a signal SHV outputted from SHV charge pump 294, detects whether the potential of signal SHV has reached a predetermined potential or not, and outputs a signal φC2.

In response to signal φC2, SHV oscillator 290 outputs a clock signal for boosting SHV charge pump 294.

In the erasing operation, SHV charge pump 294 outputs signal SHV having the potential boosted in response to the clock signal outputted from SHV oscillator 290. Signal SHV has the drain potential at the time of the erasing operation.

HV detecting circuit 287, HV oscillator 291, and HV charge pump 295 construct a booster circuit.

HV detecting circuit 287 receives a signal HV outputted from HV charge pump 295, detects whether the potential of signal HV has reached a predetermined potential or not, and outputs a signal φC3.

In response to signal φC3, SHV oscillator 291 outputs a clock signal for boosting HV charge pump 295.

In the writing operation, HV charge pump 295 outputs signal HV having the potential boosted in response to the clock signal outputted from HV oscillator 291. Signal HV has the drain potential at the time of the writing operation.

HGV detecting circuit 288, HGV oscillator 292, and HGV charge pump 296 construct a booster circuit.

HGV detecting circuit 288 receives a signal HGV outputted from HGV charge pump 296, detects whether the potential of signal HGV has reached a predetermined potential or not, and outputs a signal φC4.

In response to signal φC4, HGV oscillator 292 outputs a clock signal for boosting HGV charge pump 296.

In the reading operation, HGV charge pump 296 outputs signal HGV having the potential boosted in response to the clock signal outputted from HGV oscillator 292. Signal HGV has the gate potential at the time of the reading operation.

Figure 14:
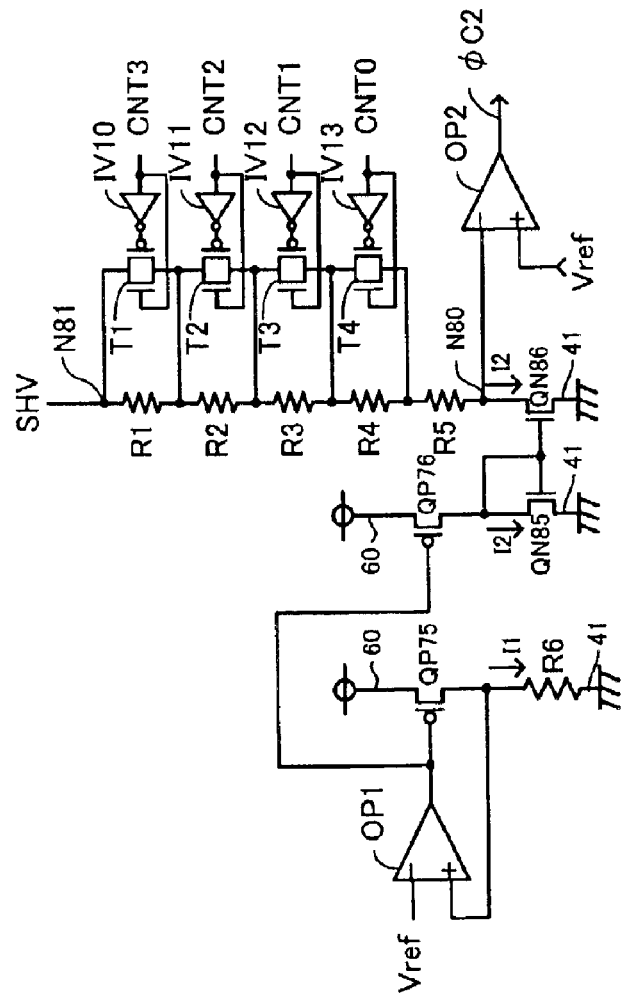
FIG. 14 is a circuit diagram showing the configuration of an SHV detecting circuit in FIG. 13.

FIG. 14 is a circuit diagram showing the configuration of an SHV detecting circuit in FIG. 13.

Referring to FIG. 14, SHV detecting circuit 286 includes P-channel MOS transistors QP75 and QP76, N-channel MOS transistors QN85 and QN86, resistive elements R1 to R6, transfer gates T1 to T4, inverters IV10 to IV13, and operational amplifiers OP1 and OP2.

Transistor QP75 and resistive element R6 are connected in series between power supply potential node 60 and ground potential node 41. An output terminal of operational amplifier OP1 is connected to the gate of transistor QP75. A reference potential Vref is inputted to an inversion input terminal of operational amplifier OP1. A non-inversion input terminal of operational amplifier OP1 is connected to the drain of transistor QP75.

Transistors QP76 and QN85 are connected in series between power supply potential node 60 and ground potential node 41. The gate of transistor QP76 is connected to an output terminal of operational amplifier OP1. Transistor QN85 is diode-connected.

Resistive elements R1 to R5 and transistor QN86 are connected in series. To a terminal which is not connected to resistive element R2, as one of two terminals of resistive element R1, signal SHV outputted from SHV charge pump 294 is inputted. The drain of transistor QN86 is connected to resistive element R5, and the gate of transistor QN86 is connected to the gate of transistor QN85. The source of transistor QN86 is connected to ground potential node 41.

Each of transfer gates T1 to T4 is constructed by an N-channel MOS transistor and a P-channel MOS transistor.

Transfer gate T1 and resistive element R1 are connected in parallel. An output signal of inverter IV10 is inputted to the gate of the P-channel MOS transistor in transfer gate T1. To inverter IV10 and the gate of the N-channel MOS transistor, count signal CNT3 outputted from count circuit 282 is inputted. Transfer gate T2 and resistive element R2 are connected in parallel. An output signal of inverter IV11 is inputted to the gate of the P-channel MOS transistor in transfer gate T2. To inverter IV11 and the gate of the N-channel MOS transistor, count signal CNT2 outputted from count circuit 282 is inputted. Transfer gate T3 and resistive element R3 are connected in parallel. An output signal of inverter IV12 is inputted to the gate of the P-channel MOS transistor in transfer gate T3. Count value CNT1 outputted from count circuit 282 is inputted to inverter IV12 and the gate of the N-channel MOS transistor. Transfer gate T4 and resistive element R4 are connected in parallel. An output signal of inverter IV13 is inputted to the gate of the P-channel MOS transistor in transfer gate T4. To inverter IV13 and the gate of the N-channel MOS transistor, count signal CNT0 outputted from count circuit 282 is inputted.

The inversion input terminal of operational amplifier OP2 is connected to a node N80 as a connection point of resistive element R5 and transistor QN86. Reference potential Vref is inputted to the non-inversion input terminal of operational amplifier OP2. When the potential inputted to the inversion input terminal is higher than reference potential Vref inputted to the non-inversion input terminal, operational amplifier OP2 outputs signal φC2 of the L level. When the potential inputted to the inversion input terminal is lower than reference potential Vref inputted to the non-inversion input terminal, operational amplifier OP2 outputs signal φC2 of the H level.

The operation of SHV detecting circuit 286 will now be described.

When the potential inputted to the non-inversion input terminal of operational amplifier OP1 is lower than reference potential Vref inputted to the inversion input terminal, operational amplifier OP1 outputs an L-level signal. At this time, therefore, transistor QP75 is turned on. As a result, the potential inputted to the non-inversion input terminal of operational amplifier OP1 increases. When the potential of the non-inversion input terminal becomes higher than reference potential Vref, an output signal of operational amplifier OP1 becomes H level. Therefore, transistor QP75 is turned off. As a result, the potential of the non-inversion input terminal decreases. Since the potential of the non-inversion input terminal becomes constant, a current I1 flowing in resistive element R6 becomes a constant value Vref/R6.

Since an output signal of operational amplifier OP1 is also inputted to the gate of transistor QP76, if the size of transistor QP75 and that of transistor QP76 are set to the same, a current I2 flowing in transistor QN85 also becomes constant value Vref/R6. Further, if the size of transistor QN85 and that of transistor QN86 are set to the same, a gate-source potential of transistor QN85 and that of transistor QN86 are the same. Consequently, a current flowing in transistor QN86 becomes constant value Vref/R6. That is, the current flowing in node N80 becomes constant. All of transistors QP75, QP76, QN85, and QN86 operate in a saturation region.

Therefore, the potential inputted to the inversion input terminal of operational amplifier OP2 is determined by the potential of signal SHV and a resistance value used between nodes N81 and N80. The resistance value used between nodes N81 and N80 is determined on the basis of the count value of count circuit 282, concretely, determined on the basis of count signals CNT0 to CNT3 outputted from count circuit 282.

Since the circuit configuration of each of SHGV detecting circuit 285, HV detecting circuit 287, and HGV detecting circuit 288 is the same as that of SHV detecting circuit 286, its description will not be repeated.

Referring again to FIG. 1, when signal RE is received from memory control circuit 28, first multiplexer 23 outputs signal OUT2 received from sense amplifier circuit 22 to output buffer 24. When signal PV or EV is received from memory control circuit 28, first multiplexer 23 outputs signal OUT2 received from sense amplifier circuit 22 to comparator 25.

Input buffer 27 receives external data signals DQ0 to DQ7 inputted from the outside and outputs internal data signals DIN0 to DIN7.

Further, input buffer 27 outputs signal IN0 to IN7 on the basis of external data signals DQ0 to DQ7.

Second multiplexer 26 receives signal PV from memory control circuit 28 at the time of a writing operation and outputs signals IN0 to IN7. Second multiplexer 26 receives signal EV from memory control circuit 28 at the time of an erasing operation, and outputs H-level signals HIN0 to HIN7.

At the time of a writing operation, comparator 25 compares signal OUT2 (OUT20 to OUT27) outputted from first multiplexer 23 with signals IN0 to IN7 outputted from second multiplexer 26, respectively and, when signal OUT2 coincides with signals IN0 to IN7, outputs signal VERIFY of the H level to memory control circuit 28. At the time of an erasing operation, comparator 25 compares signal OUT2 outputted from first multiplexer 23 with signals HIN0 to HIN7 of the H level outputted from second multiplexer 26 and, when all of signals OUT2 are at the H level, outputs signal VERIFY of the H level to memory control circuit 28.

The writing operation of semiconductor memory device 100 having the above circuit configuration will be described.

Figure 15:
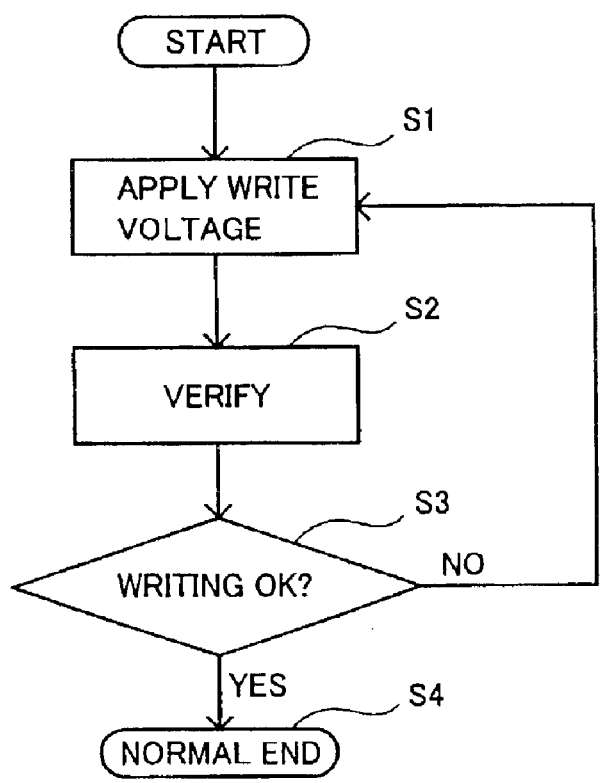
FIG. 15 is a flowchart showing a writing operation of the semiconductor memory device in the first embodiment of the present invention.

FIG. 15 is a flowchart showing the writing operation of the semiconductor memory device in the first embodiment of the present invention.

A case of writing data into storing region 9R in FIG. 30 in an arbitrary memory cell in memory cell array 20 in semiconductor memory device 100 will now be described.

Referring to FIG. 15, first, the count value of count circuit 282 in memory control circuit 28 is reset by a reset signal RESET outputted from peripheral circuit 281. Reset signal RESET is always set to the L level. At this time, therefore, all of count signals CNT0 to CNT3 outputted from count circuit 282 become L level. All of signals PG, PV, ER, and EV outputted from peripheral circuit 281 are at the H level.

After that, in order to apply a write voltage to a memory cell, memory control circuit 28 activates signal PG outputted from peripheral circuit 281 to the L level. The other signals PV, ER, and EV outputted from peripheral circuit 281 maintain the H level. At this time, HV detecting circuit 287, HV oscillator 291, and HV charge pump 295 operate. As a result, HV charge pump 295 outputs drain voltage HV to be applied to a memory cell.

Similarly, by the activation of signal PG, SHGV detecting circuit 285, SHGV oscillator 289, and SHGV charge pump 293 operate. As a result, SHGV charge pump 293 outputs gate voltage SHGV to be applied to a memory cell (step S1).

Subsequently, after elapse of a predetermined period since a write voltage is applied, semiconductor memory device 100 performs a verifying operation (step S2).

The verifying operation is an operation for determining whether data is normally written in a memory cell or not after applying the write voltage to the memory cell.

When the verifying operation is performed, signal PG outputted from peripheral circuit 281 becomes H level, and signal PV is activated to the L level. As a result, a predetermined voltage is applied to the gate and source of the memory cell, and data written in the memory cell is read out by sense amplifier circuit 22. The read data is inputted as signal OUT2 to comparator 25 via first multiplexer 23. On the other hand, comparator 25 receives signal IN as data information written into the memory cell from second multiplexer 26.

Comparator 25 compares signal OUT2 with signal IN, and detects whether 8-bit digital data of signal OUT2 coincides with 8-bit digital data of signal IN or not. In the case where data of signal OUT2 and data of signal IN coincide with each other (step S3), it is determined that data to be written into the memory cell is normally written, that is, charges accumulated in storing region 9R in the memory cell are sufficient, and the writing operation is finished (step S4).

On the other hand, in the case where data of signal OUT2 and data of signal IN do not coincide with each other (step S3), comparator 25 determines that charges accumulated in storing region 9R in the memory cell are insufficient.

Returning again to step S2, semiconductor memory device 100 repeats application of the write voltage until a predetermined amount of charges is accumulated in storing region 9R in the memory cell.

With respect to the erasing operation as well, similarly, after applying an erase voltage, the verifying operation is performed, and application of the erase voltage is repeated until charges in storing region 9R in the memory cell are discharged.

Figure 16:
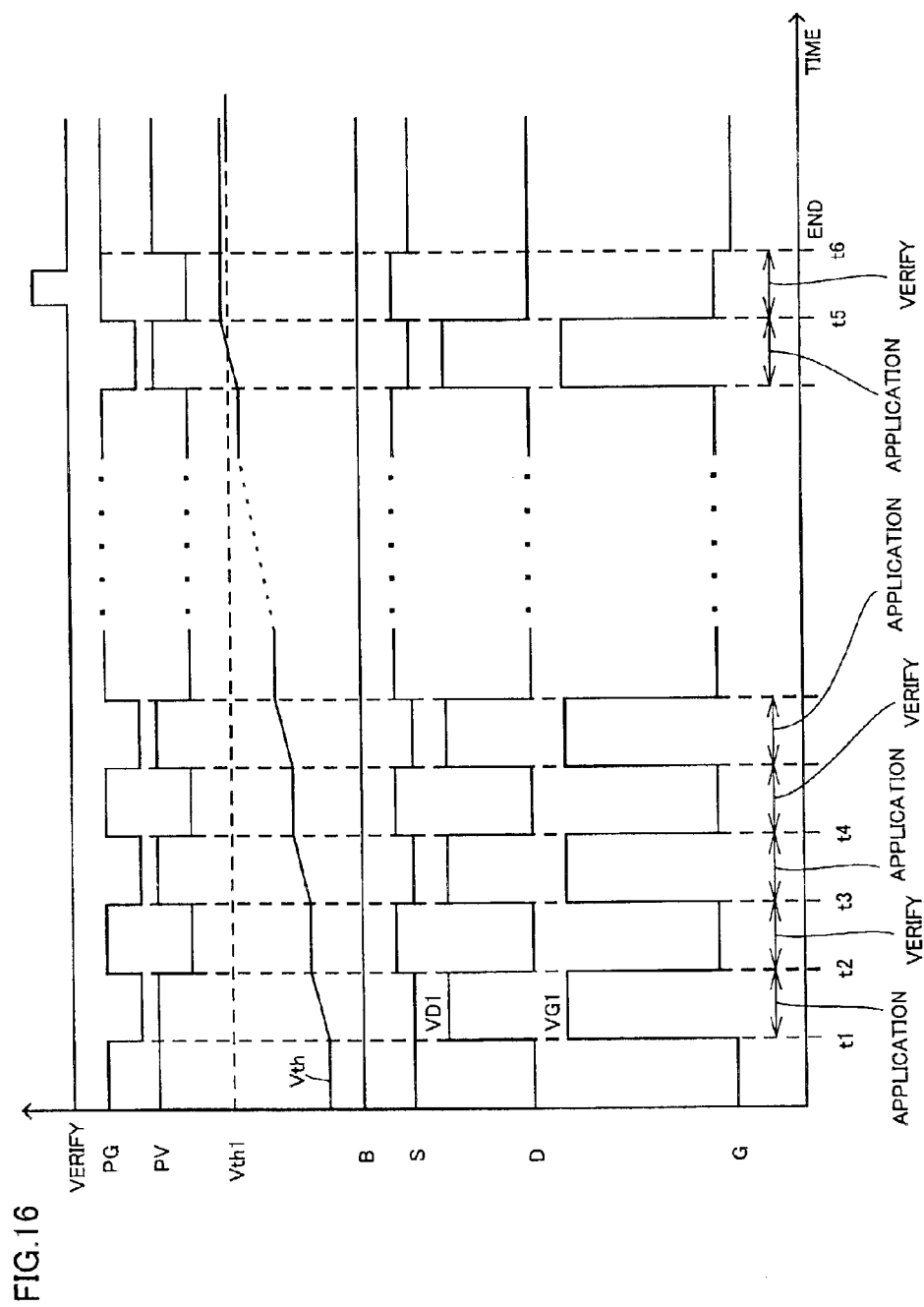
FIG. 16 is a timing chart at the time of the writing operation of the semiconductor memory device in the first embodiment of the present invention.

FIG. 16 is a timing chart of the writing operation in the semiconductor memory device in the first embodiment of the present invention.

It is assumed that the writing operation of the semiconductor memory device in FIG. 16 is performed under the same conditions as those for the writing operation in FIG. 15. Vth in FIG. 16 indicates a written threshold voltage of the memory cell. B indicates a voltage of the semiconductor substrate of the memory cell, S indicates a voltage applied to diffusion bit line 7A of the memory cell, D denotes a voltage (voltage of signal HV) applied to diffusion bit line 7B of the memory cell, and G denotes a voltage (voltage of signal SHGV) applied to control gate 11 of the memory cell.

Referring to FIG. 16, signal PG is activated to the L level at time t1, and semiconductor memory device 100 performs application of the write voltage of the first time. The other signals PV, ER, and EV outputted from peripheral circuit 281 at this time maintain the H level. At this time, HV detecting circuit 287, HV oscillator 291, and HV charge pump 295 operate. As a result, HV charge pump 295 outputs drain voltage HV to be applied to the memory cell. Signal HV is maintained at a constant voltage VD1.

Similarly, by the activation of signal PG, SHGV detecting circuit 285, SHGV oscillator 289, and SHGV charge pump 293 operate. As a result, SHGV charge pump 293 outputs signal HGV to be applied to the gate of the memory cell. At this time, signal HGV is maintained at a constant voltage VG1.

At time t2 after the write voltage is applied for a predetermined period, signal PG becomes H level and signal PV becomes L level. As a result, semiconductor memory device 100 starts the verifying operation.

Assuming now that when the threshold voltage of the memory cell becomes Vth1, sufficient charges are accumulated in storing region 9R in the memory cell. Threshold voltage Vth of the memory cell at time t2 is lower than Vth1. Therefore, comparator 25 determines that charges accumulated in storing region 9R are insufficient. As a result, signal PG becomes L level at time t3, and the write voltage is applied again.

Subsequently, at time t4, a verifying operation is performed. Since the operating method is the same as that at time t2, its description will not be repeated.

By the above operations, until threshold value Vth of the memory cell to which the writing operation is performed becomes Vth1, semiconductor memory device 100 repeats application of the write voltage and the verifying operation. When threshold value Vth of the memory cell exceeds Vth1 as a result of the verifying operation at time t5, comparator 25 outputs pulse signal VERIFY of the H level. Memory control circuit 28 receives signal VERIFY of the H level and finishes the writing operation at time t6.

The case of the erasing operation is similar to the above. In the case of the erasing operation, whether the threshold value of the memory cell becomes equal to or lower than a predetermined voltage (for example, 1.5V or less) is determined in the verifying operation. If the threshold is not equal to or lower than the predetermined voltage, the erasing operation is repeated.

By the above operation, semiconductor memory device 100 in the first embodiment repeats application of the write voltage and the verifying operation at the time of the writing operation. As a result, charges are prevented from being excessively injected into the memory cell. With respect to the erasing operation, similar operations are performed.

Figure 17:
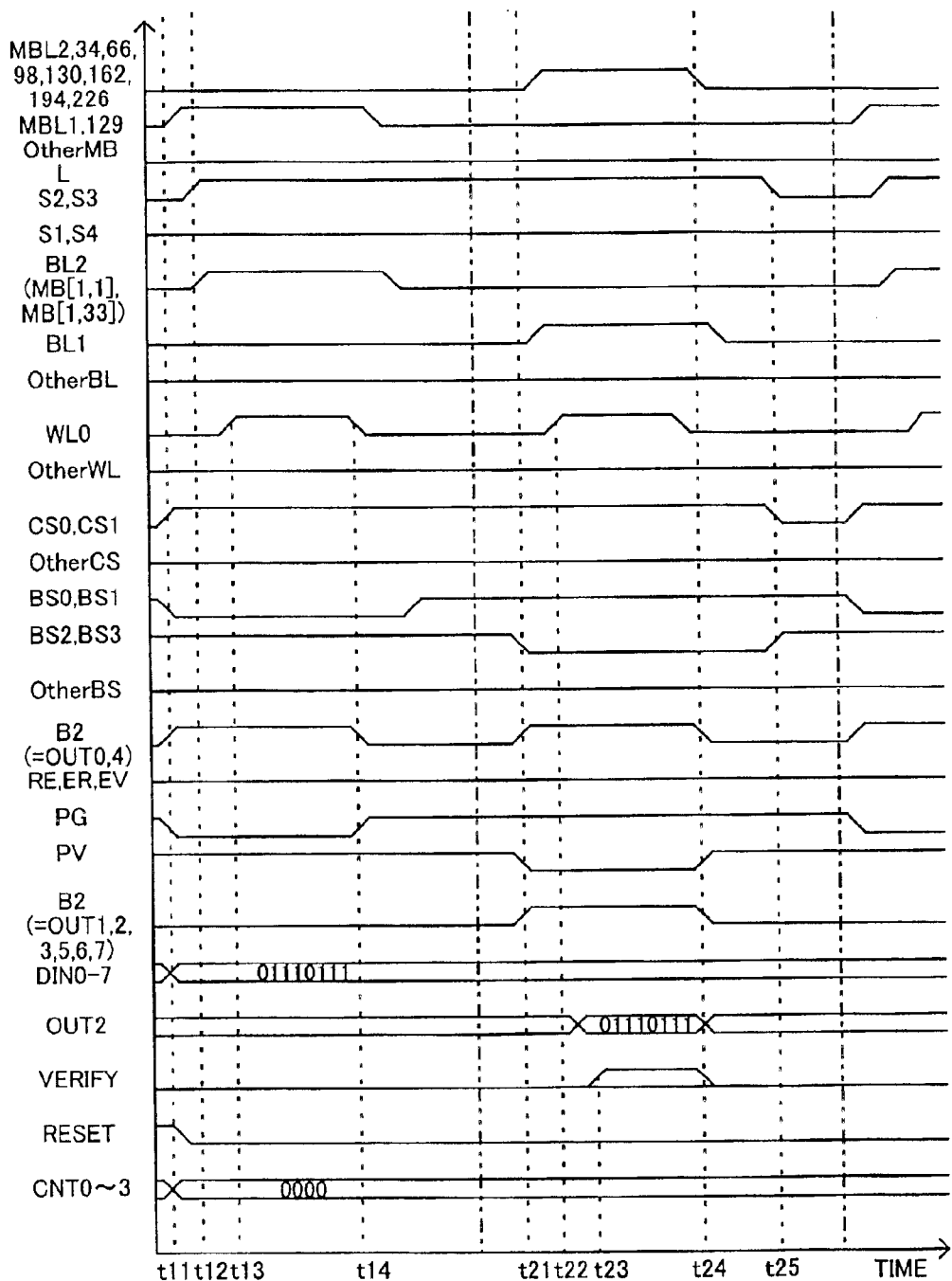
FIG. 17 is a timing chart showing the operation of each of circuits in the semiconductor memory device at the time of the writing operation.

FIG. 17 is a timing chart showing the operations of circuits in the semiconductor memory device at the time of the writing operation.

In FIG. 17, a case of writing data "01110111" into storing region 9R in a memory cell MC1 in FIG. 2 with respect to memory blocks MB [1, 1], MB [1, 9], MB [1, 17], MB [1, 25], MB [1, 33], MB [1, 41], MB [1, 49], and MB [1, 57] in semiconductor memory device 100 shown in FIG. 1 will be described. Concretely, data "0" is stored in memory cell MC1 in each of memory blocks MB [1, 1] and MB [1, 33], and data "1" is stored in memory cell MC1 of each of the other memory blocks MB. "0" denotes a state where the threshold value is high, and "1" indicates a state where the threshold value is low.

Referring to FIG. 17, first, signal PG outputted from peripheral circuit 281 at time t11 is activated to the L level. Among signals CS0 to CS7 to be inputted to core circuits 211 to 218 in bit line control circuit 21, signals CS0 and CS1 become H level. The other signals CS2 to CS7 remain at the L level.

Among signals BS0 to BS15 to be inputted to core circuits 211 to 218, signals BS0 and BS1 become L level, and the other signals BS2 to BS15 maintain the H level.

As a result, transistors QN30 and QN31 in first column selectors 31 to 34 in core circuits 211 to 218 are turned on. Transistors QP40 and QN41 in second column selector 35 are also turned on. Consequently, in memory block MB [1,1], main bit line MBL2 is connected to node N40 in second column selector 35, and main bit line MB1 is connected to node N41. Similarly, in each memory block [1, 8J+1] (J: integer from 0 to 7), a main bit line MBL (4×(8J+1)−2) is connected to node N40 in second column selector 35 in each core circuit, and a main bit line MBL (4×(8J+1)−3) is connected to node N41.

Attention is now paid to potential control circuit 36 in core circuit 211. At time t11, signal DIN0 to be written into memory cell MC1 in memory block MB [1, 1] becomes at the L level (corresponding to data "0"), so that switch circuit SW2 is turned on. As a result, the potential on main bit line MBL1 becomes potential HV. On the other hand, main bit line MBL2 is connected to ground potential node 41.

Similarly, the potential on main bit line MBL129 in memory block [1,33] becomes potential HV, and main bit line MBL2 is connected to ground potential node 41.

In the other memory block MB [1, 8J+1], internal data signal DIN to be inputted to corresponding potential control circuit 36 becomes H level (corresponding to data "1"). As a result, all of signals E8, E5, and E2 in potential control circuit 36 become L level, and transistor QN51 is turned on. Therefore, both of main bit lines MBL (4×(8J+1)−2) and MBL (4×(8J+1)−3) in memory block MB [1, 8J+1] become L level.

By the above operations, main bit line MBL1 in memory block MB [1, 1] is maintained at potential HV (H level), and main bit line MBL2 becomes L level. Main bit line MBL129 in memory block MB [1, 33] is maintained at potential HV (H level), and main bit line MBL2 becomes L level.

After that, at time t12, among signal lines S1 to S4 in memory block MB, signal lines S2 and S3 become H level. At this time, signal lines S1 and S4 maintain the L level. Therefore, transistors QN3 and QN5 are turned on. As a result, in memory block MB[1,1], main bit line MBL1 is connected to bit line BL2, and main bit line MBL2 is connected to bit line BL1. Similarly, in memory block MB [1, 33], main bit line MBL129 is connected to bit line BL2, and main bit line MBL130 is connected to bit line BL1. As a result, bit line BL2 is maintained at potential HV (H level), and bit line BL1 is maintained at the ground potential (L level).

Subsequently, word line WL0 is activated to the H level at time t13. As a result, operation of writing data to storing region 9R in memory cell MC1 in memory blocks MB [1, 1] and MB [1, 33] is performed, and charges are accumulated in storing region 9R.

By the above operations, a write voltage is applied to a designated memory cell, and writing operation is performed.

At time t14, signal PG becomes H level. At this time, word line WL0 becomes L level, and the writing operation is finished. Since signal PG becomes H level, supply of potential HV to main bit line MBL is stopped and, after completion of the writing operation, main bit lines MBL1 and MBL129 become L level. As a result, bit line BL2 also becomes L level. After main bit lines MBL1 and MBL129 become L level, signals BS0 and BS1 become H level.

At time t21, signal PV becomes L level. Therefore, semiconductor memory device 100 performs a verifying operation.

At the time of the verifying operation, signals BS0 and BS1 in the core circuit maintain the H level, and signals BS2 and BS3 become L level. Therefore, in memory block MB [1, 1], transistors QN40 and QP41 in second column selector 35 are turned on. As a result, main bit line MBL1 is connected to node N40, and main bit line MBL2 is connected to node N41.

Since signals RE and EV are at the H level and signal PV is at the L level, signal E2 outputted from logic gate L3 in potential control circuit 36 becomes H level. As a result, switch circuit SW3 is turned on, and main bit line MBL2 (corresponding to signal B2) is maintained at the read potential (about 2V). On the other hand, main bit line MBL1 is connected to ground potential node 41, and the potential of main bit line MBL1 (corresponding to signal B1) maintains the ground potential.

Also in other memory block MB [1, 8J+1], similarly, main bit line MBL (4×8J+1)−2) (corresponding to signal B2) is maintained at the reading potential (about 2V), and main bit line MBL (4×(8J+1)−3) (corresponding to signal B1) is maintained at the ground potential.

As a result, bit line BL1 in each memory block MB [1, 8J+1] is maintained at the read potential, and bit line BL2 is maintained at the ground potential.

After that, when word line WL0 is activated to the H level (about 3V in the reading operation) at time t22, the operation of reading data from storing region 9R in memory cell MC1 in each memory block MB [1, 8J+1] is started.

As a result, sense amplifier circuit 22 reads data in storing region 9R in memory cell MC1 in each memory block MB [1, 8J+1], and outputs the result as signal OUT2 to comparator 25 via first multiplexer 23.

At time t23, comparator 25 compares the result of signal OUT2 with signal IN as storage information outputted from second multiplexer 26.

When signals OUT2 and IN do not coincide with each other as a result of comparison, that is, when storage of charges is insufficient for even one of data in storing region 9R in memory cell MC1 in memory block MB [1, 8J+1], comparator 25 outputs signal VERIFY of the L level. On the other hand, when signals OUT2 and IN coincide with each other, comparator 25 outputs signal VERIFY at the H level.

When signal PV becomes H level at time t24, potential control circuit 36 in the core circuit stops supply of the read potential to main bit line MBL. Word line WL0 becomes L level. Therefore, the verifying operation is finished.

All of signals S1 to S4 become L level at time t25 after completion of the verifying operation, and all of signals CS0 to CS7 also become L level. All of signals BS0 to BS15 become H level.

As a result of the verifying operation, when signal VERIFY is at the L level, the writing operation is performed again after time t25. As the operation at that time, the operations performed at times t11 to t14 are repeated. After completion of the writing operation, the verifying operation is performed again and the writing operation is repeated until signal VERIFY becomes H level.

As a result of the verifying operation, when signal VERIFY is at the H level, the semiconductor memory device finishes the writing operation.

By the above operation, the data "01110111" is written in storing region 9R in memory cell MC1 in FIG. 2 with respect to memory blocks MB [1, 1], MB [1, 9], MB [1, 17], MB [1, 25], MB [1, 33], MB [1, 41], MB [1, 49] and MB [1, 57] in semiconductor memory device 100.

The erasing operation will now be described.

Figure 18:
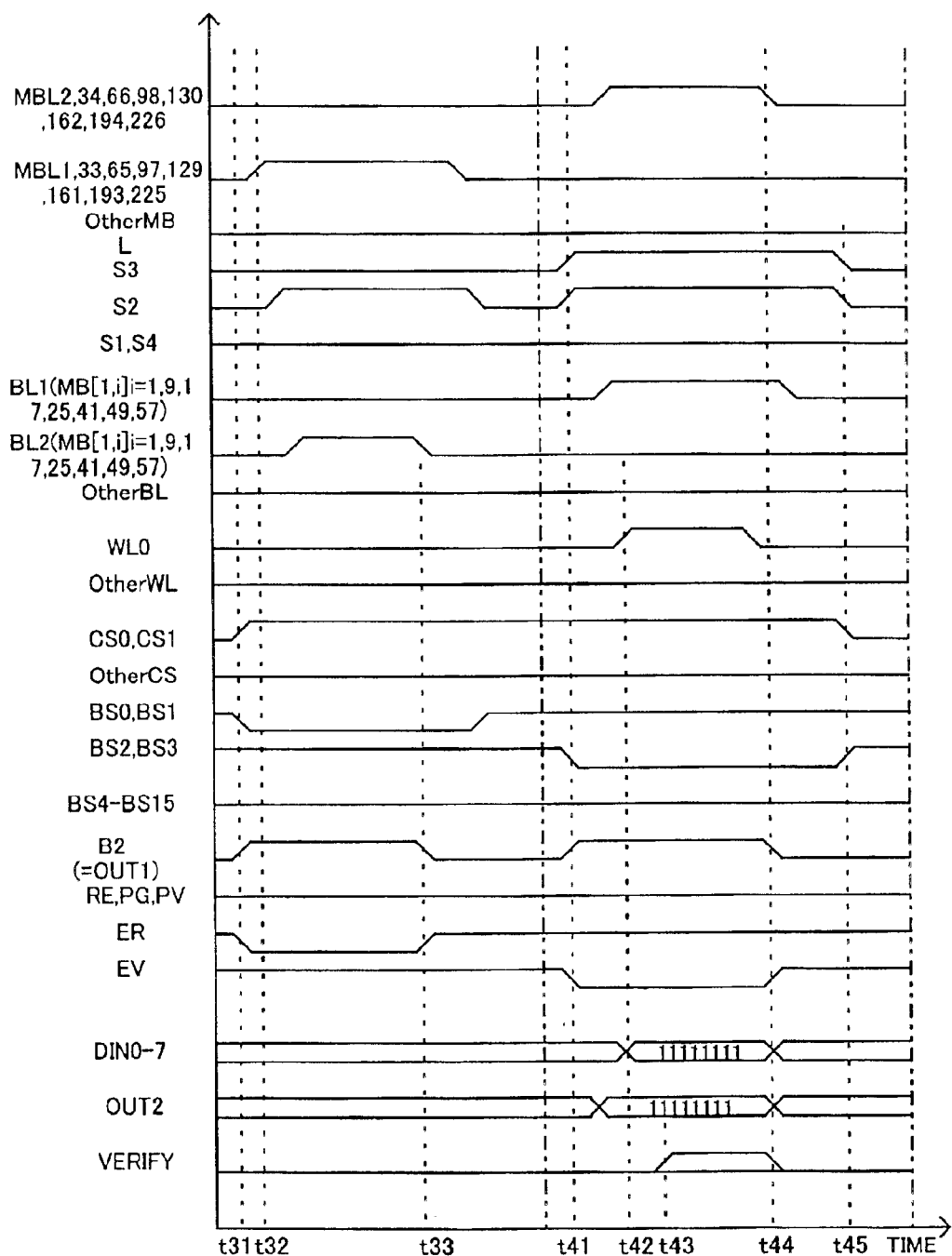
FIG. 18 is a timing chart showing the operation of each of circuits in the semiconductor memory device at the time of an erasing operation.

FIG. 18 is a timing chart showing the operations of circuits in the semiconductor memory device at the time of the erasing operation.

In FIG. 18, a case of erasing all of data in storing region 9R in memory cell MC1 in FIG. 2 with respect to memory blocks MB [1, 1], MB [1, 9], MB [1, 17], MB [1, 25], MB [1, 33], MB [1, 41], MB [1, 49], and MB [1, 57] in semiconductor memory device 100 shown in FIG. 1 will be described. Concretely, data "1" is stored in memory cell MC1 in each of memory blocks MB. In this case, "0" denotes a state where the threshold value is high, and "1" indicates a state where the threshold value is low.

Referring to FIG. 18, at time t31, signal ER outputted from peripheral circuit 281 is activated to the L level.

Among signals CS0 to CS7 to be inputted to core circuits 211 to 218 in bit line control circuit 21, signals CS0 and CS1 become H level. The other signals CS2 to CS7 remain at the L level.

Among signals BS0 to BS15 to be inputted to core circuits 211 to 218, signals BS0 and BS1 become L level, and the other signals BS2 to BS15 maintain the H level.

As a result, transistors QN30 and QN31 in first column selectors 31 to 34 in core circuits 211 to 218 are turned on. Transistors QP40 and QN41 in second column selector 35 are also turned on. Consequently, in memory block MB [1, 1], main bit line MBL2 is connected to node N40 in second column selector 35, and main bit line MBL1 is connected to node N41. Similarly, in each memory block [1, 8J+1] (J: integer from 0 to 7), main bit line MBL (4×(8J+1)−2) is connected to node N40 in second column selector 35 in each core circuit, and main bit line MBL (4×(8J+1)−3) is connected to node N41.

Attention is now paid to potential control circuit 36 in core circuit 211. At time t31, signal ER becomes at the L level, so that switch circuit SW1 is turned on. As a result, the potential on main bit line MBL1 becomes potential SHV. On the other hand, main bit line MBL2 is connected to ground potential node 41.

Similarly, also in each memory block MB [1, 8J+1] (J: integer from 0 to 7), main bit line MBL (4×8J+1)−2) is connected to ground potential node 41, and the potential on main bit line MBL (4×(8J+1)−3) is maintained at potential SHV.

After that, at time t32, among signal lines S1 to S4 in memory block MB, only signal line S2 becomes H level. Therefore, transistor QN2 is turned on. As a result, in memory block MB [1, 1], main bit line MBL1 is connected to bit line BL2. On the other hand, the other main bit lines MBL2 to MBL4 are not connected to any bit lines BL.

As a result, potential SHV is applied to the drain of each of all of memory cells connected to bit line BL2, and the source becomes a floating potential. Therefore, in all of memory cells connected to bit line BL2, the erasing operation is started. For example, in the case where the number of memory cells per column in each memory block MB is 32, in memory block MB [1, 1], in storing regions 9R of the 32 memory cells connected between bit lines BL2 and BL1, and storing regions 9L in the 32 memory cells connected between bit lines BL2 and BL3, erasing operation of 64 bits is performed at once. Similarly, in each memory block [1, 8J+1] (J: integer from 0 to 7), an operation of erasing 64 bits is performed. In the whole semiconductor memory device, the operation of erasing data of 512 bits is performed after time t32.

At time t33, signal ER becomes H level. At this time, supply of potential SHV to main bit line MBL (4×(8J+1)−3) is stopped, and bit line MBL (4×(8J+1)−3) becomes L level after the erasing operation. Accordingly, bit line BL2 becomes L level. After main bit line MBL (4×(8J+1)−3) becomes L level, signals BS0 and BS1 become H level.

At time t41, signal EV becomes L level, so that semiconductor memory device 100 performs the verifying operation.

In the verifying operation, signals BS0 and BS1 in the core circuit maintain the H level, and signals BS2 and BS3 become L level. Therefore, in memory block MB [1, 1], transistors QN40 and QP41 in second column selector 35 are turned on. As a result, main bit line MBL1 is connected to node N40, and main bit line MBL2 is connected to node N41.

At this time, since signals RE and PV are at the H level and signal EV is at the L level, signal E2 outputted from logic gate L3 in potential control circuit 36 becomes H level. As a result, switch circuit SW3 is turned on, and main bit line MBL2 (corresponding to signal B2) is connected to sense amplifier circuit 22 and is maintained at read potential (about 2V) by sense amplifier circuit 22. On the other hand, main bit line MBL1 is connected to ground potential node 41, and the potential of main bit line MBL1 (corresponding to signal B1) maintains the ground potential.

Also in other memory block M [1, 8J+1], similarly, main bit line MBL (4×(8J+1)–2) (corresponding to signal B2) is maintained at the read potential (about 2V), and main bit line MBL (4×(8J+1)–3) (corresponding to signal B1) is maintained at the ground potential.

As a result, bit line BL1 in each memory block MB [1, 8J+1] is maintained at the read potential, and bit line BL2 is maintained at the ground potential.

When word line WL0 is activated to the H level (about 3V at the time of the reading operation) at time t42, the operation of reading data in storing region 9R in memory cell MC1 in each memory block MB [1, 8J+1] is started.

As a result, sense amplifier circuit 22 reads data in storing region 9R in memory cell MC1 in each memory block MB [1, 8J+1] and outputs the result as signal OUT2 to comparator 25 via first multiplexer 23.

At time t43, comparator 25 compares the result of signal OUT2 with a signal HIN outputted from second multiplexer 26.

As a result of the comparison, if signals OUT2 and HIN do not coincide with each other, that is, when accumulation of charges for even one of data in storing region 9R in memory cell MC1 in each memory block MB [1, 8J+1] is insufficient, comparator 25 outputs signal VERIFY of the L level. On the other hand, when signals OUT2 and HIN coincide with each other, comparator 25 outputs signal VERIFY of the H level.

When signal EV becomes H level at time t24, potential control circuit 36 in the core circuit stops supply of the read potential to main bit line MBL. Word line WL0 becomes L level.

At time t45 after completion of the verifying operation, all of signals S1 to S4 become L level, and all of signals CS0 to CS7 become L level. All of signals BS0 to BS15 become H level.

When signal VERIFY is at the L level as a result of the verifying operation, after time t45, the erasing operation is carried out again. The operation at this time is repetition of the operation performed at time t31 to t33. After completion of the erasing operation, the verifying operation is performed again, and the erasing operation is repeated until signal VERIFY becomes H level.

When signal VERIFY is at the H level as a result of the verifying operation, the semiconductor memory device finishes the erasing operation.

The amount which can be verified simultaneously is one memory cell per memory block MB, that is, eight bits in the whole memory cell array. Therefore, the semiconductor memory device performs similar verifying operation in 64 cycles while changing a word line to be activated and a bit line BL to be activated.

After performing the verifying operation on all of memory cells, the verifying operation is finished.

By the above operation, semiconductor memory device 100 in the first embodiment repeats application of the write voltage and the verifying operation at the time of the writing operation. As a result, charges can be prevented from being excessively injected to a memory cell.

Second Embodiment

In the first embodiment, the voltage applied to a memory cell in the writing operation is set to be constant. However, each time the writing operation is repeated, the voltage to be applied to a memory cell can be changed.

Figure 19:
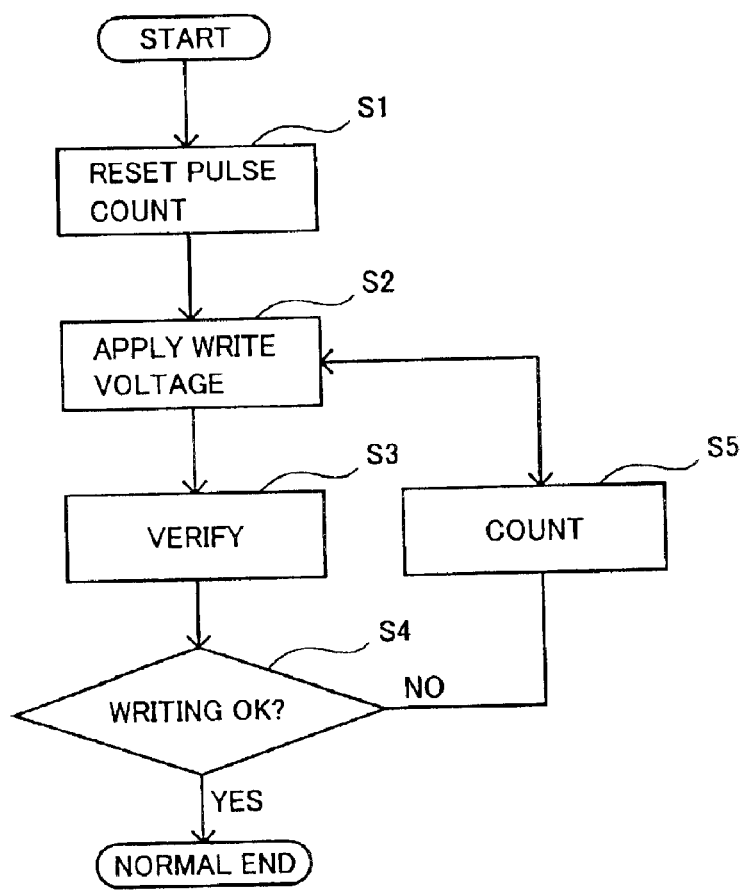
FIG. 19 is a flowchart showing the writing operation of a semiconductor memory device in a second embodiment of the present invention.

FIG. 19 is a flowchart showing the writing operation of a semiconductor memory device in the second embodiment of the present invention.

In a manner similar to FIG. 15, a case of writing data into storing region 9R in FIG. 30 in an arbitrary memory cell in memory cell array 20 in semiconductor memory device 100 will be described.

Referring to FIG. 19, first, the count value of count circuit 282 in memory control circuit 28 is reset by reset signal RESET outputted from peripheral circuit 281 (step S1). All of count signals CNT0 to CNT3 outputted from count circuit 282 therefore become L level at this time. All of signals PG, PV, ER, and EV outputted from peripheral circuit 281 are at the H level.

After that, to apply the write voltage to a memory cell, memory control circuit 28 activates signal PG outputted from peripheral circuit 281 to the L level. At this time, other signals PV, ER, and EV outputted from peripheral circuit 281 maintain the H level, and HV detecting circuit 287, HV oscillator 291, and HV charge pump 295 operate. As a result, HV charge pump 295 outputs drain voltage HV to be applied to a memory cell.

Similarly, by activation of signal PG, SHGV detecting circuit 285, SHGV oscillator 289, and SHGV charge pump 293 operate. As a result, SHGV charge pump 293 outputs gate voltage SHGV to be applied to a memory cell (step S2).

Subsequently, after elapse of a predetermined period since the write voltage is applied, semiconductor memory device 100 performs the verifying operation (step S3).

When the verifying operation is performed, signal PG outputted from peripheral circuit 281 becomes H level, and signal PV is activated to the L level. As a result, a predetermined voltage is applied to the gate and source of a memory cell, and data written in the memory cell is read by sense amplifier circuit 22. The read data is inputted as signal OUT2 to comparator 25 via first multiplexer 23. On the other hand, comparator 25 receives signal IN as data information written into the memory cell from second multiplexer 26.

Comparator 25 compares signal OUT2 with signal IN. When 8-bit digital information of signal OUT2 and 8-bit digital information of signal IN coincide with each other (step S4), it is determined that data to be written into a memory cell has been normally written, that is, charges accumulated in storing region 9R in the memory cell are sufficient, and the writing operation is finished.

On the other hand, when signals OUT2 and IN do not coincide with each other (step S4), it is determined that charges accumulated in storing region 9R in the memory cell are insufficient, and count circuit 282 counts the number of write voltage applying times (step S5). After counting, the program returns again to step S2, and the writing operation is performed.

By the above operation, semiconductor memory device 100 applies the write voltage until a predetermined amount of charges is accumulated in storing region 9R in the memory cell.

Since the erasing operation is performed in a manner similar to the writing operation, its description will not be repeated.

Figure 20:
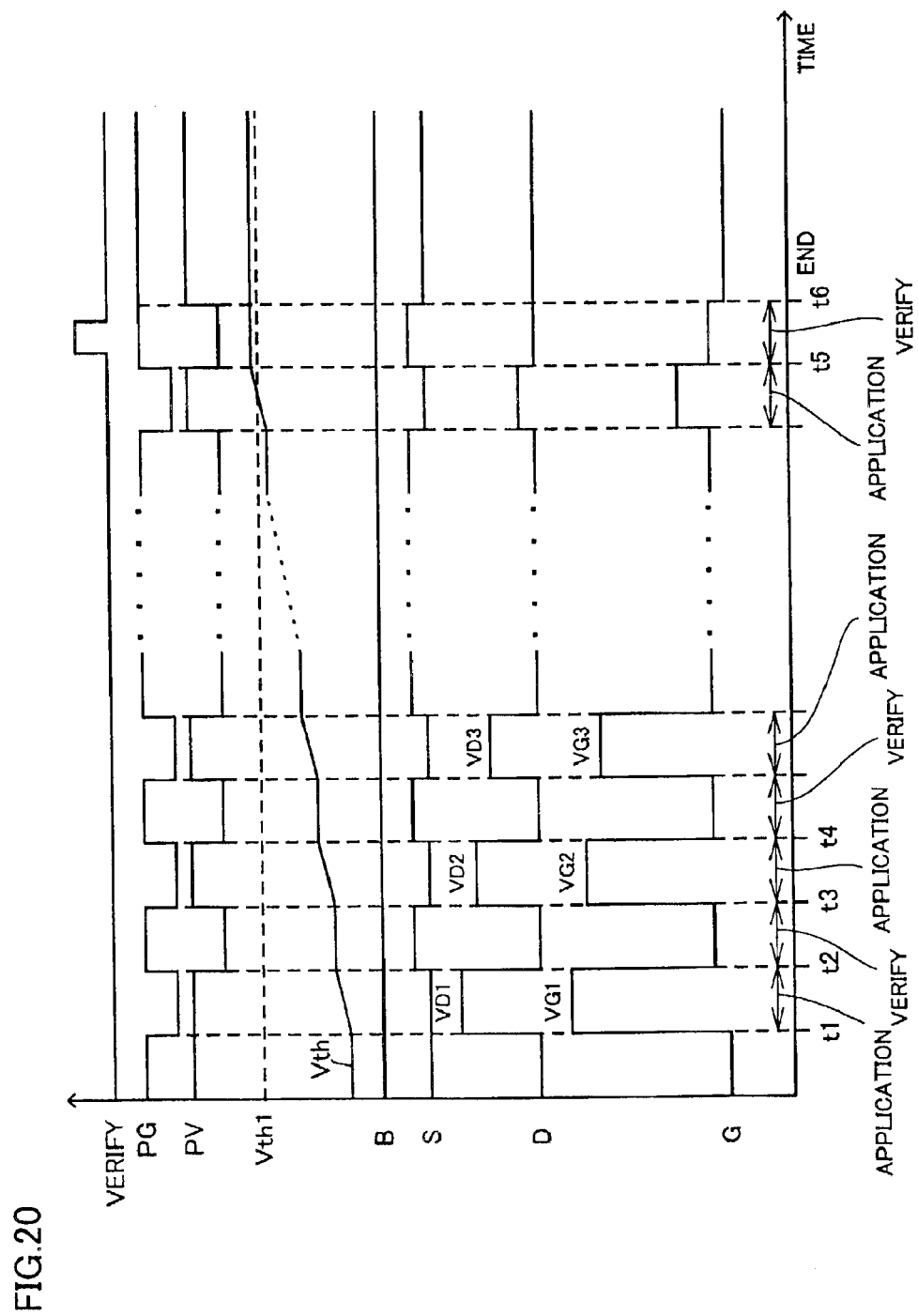
FIG. 20 is a timing chart at the time of a writing operation of the semiconductor memory device in the second embodiment of the present invention.

FIG. 20 is a timing chart of the writing operation in the semiconductor memory device in the second embodiment of the present invention.

It is assumed that the writing operation of the semiconductor memory device in FIG. 20 is performed under the same conditions as those for the writing operation in FIG. 19. Vth, B, D, and G in FIG. 20 are the same as those in FIG. 16, so that their description will not be repeated.

Referring to FIG. 20, at time t1, semiconductor memory device 100 performs application of the write voltage of the first time. At this time, the other signals PV, ER, and EV outputted from peripheral circuit 281 maintain the H level, and HV detecting circuit 287, HV oscillator 291, and HV charge pump 295 operate. As a result, HV charge pump 295 outputs drain voltage HV to be applied to the memory cell.

At this time, all of count signals CNT0 to CNT3 outputted from count circuit 282 are at the L level. Since all of transfer gates T1 to T4 in HV detecting circuit 287 are turned off, resistive elements R1 to R5 are connected in series between nodes N80 and N81 in HV detecting circuit 287. The potential of signal HV outputted from HV charge pump 295 is divided by resistive elements R1 to R5 and transistor QN86. The divided potential is outputted from node N80 to operational amplifier OP2. At this time, operational amplifier OP2 outputs signal φC2 of the H level until the voltage of a signal outputted from node N80 becomes equal to reference potential Vref. When the voltage of the output signal from node N80 becomes larger than reference potential Vref, operational amplifier OP2 outputs signal φC2 of the L level. By signal φC2, the operation of HV oscillator 291 is controlled and, as a result, HV charge pump 295 outputs signal HV to the drain of the memory cell. At this time, signal HV is maintained to constant voltage VD1.

Similarly, by the activation of signal PG, SHGV detecting circuit 285, SHGV oscillator 289, and SHGV charge pump 293 operate. As a result, SHGV charge pump 293 outputs gate voltage SHGV to be applied to the memory cell. At this time, signal SHGV is maintained at constant voltage VG1.

At time t2 after the write voltage is applied for a predetermined period, signal PG becomes H level and signal PV becomes L level. As a result, semiconductor memory device 100 starts the verifying operation. Assuming now that when the threshold voltage of a memory cell becomes Vth1, sufficient charges are accumulated in storing region 9R in the memory cell. Threshold voltage Vth of the memory cell at time t2 is lower than Vth1. Therefore, comparator 25 determines that charges accumulated in storing region 9R are insufficient. As a result, signal PG becomes L level at time t3, and the write voltage is applied again.

At the time of the verifying operation from time t2 to t3, the count number of count circuit 282 is set to "1". Therefore, count signal CNT0 becomes H level.

As a result, transfer gate T4 in HV detecting circuit 287 is turned on. Therefore, a voltage outputted from node N80 in HV detecting circuit 287 becomes equal to the potential obtained by dividing the potential of signal HV by resistive elements R1 to R3, and R5, and transistor QN86. Even in the case where the potential of the signal outputted from node N80 is lower than that at time t1, HV detecting circuit 287 outputs signal φC3 of the L level.

Consequently, voltage VD2 of signal HV outputted from HV charge pump 295 at time t2 is lower than voltage DV1 of signal HV at time t1.

For the same reason, voltage VG2 of signal HGV outputted from HGV charge pump 296 becomes lower than voltage VD1 of signal HV at time t1.

Subsequently, at time t4, a verifying operation is performed. Since the operating method is the same as that at time t2, its description will not be repeated.

By the above operations, until threshold value Vth of the memory cell on which the writing operation is performed becomes Vth1, semiconductor memory device 100 repeats application of the write voltage and the verifying operation. Each time the number of application times of the write voltage increases, the voltage to be applied decreases. When threshold value Vth of the memory cell exceeds Vth1 as a result of the verifying operation at time t5, comparator 25 outputs pulse signal VERIFY of the H level. Memory control circuit 28 receives signal VERIFY of the H level and finishes the writing operation at time t6.

By the above operation, semiconductor memory device 100 in the first embodiment repeats application of the write voltage and the verifying operation at the time of the writing operation. As a result, charges are prevented from being excessively injected into the memory cell. Further, by decreasing the write voltage to be applied each time the number of application times of the write voltage increases, the writing operation is prevented from being excessively performed on a memory cell.

With respect to the erasing operation, operations are performed in a manner similar to the writing operation, so that the description will not be repeated. At the time of the erasing operation, drain voltage become SHV and the gate voltage becomes 0V.

Figure 21:
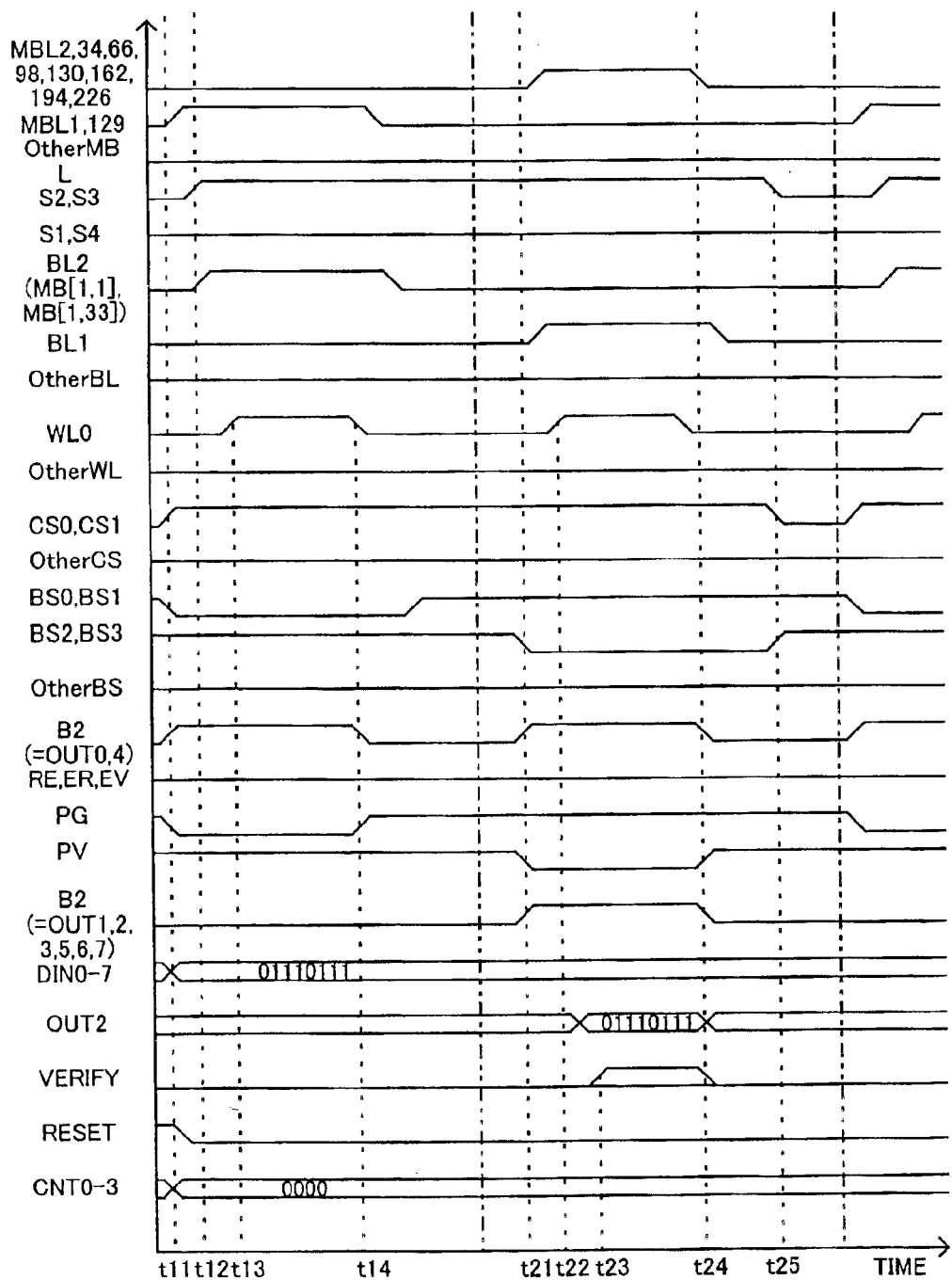
FIG. 21 is a timing chart showing operations of circuits in the semiconductor memory device in the writing operation.

FIG. 21 is a timing chart showing the operations of circuits in the semiconductor memory device at the time of the writing operation.

In FIG. 21, in a manner similar to FIG. 17, a case of writing data "01110111" into storing region 9R in memory cell MC1 with respect to memory blocks MB [1, 1], MB [1, 9], MB [1, 17], MB [1, 25], MB [1, 33], MB [1, 41], MB [1, 49], and MB [1, 57] in semiconductor memory device 100 will be described.

Referring to FIG. 21, when signal PG is activated to the L level at time t11, signal RESET also becomes L level. As a result, count circuit 282 is reset. Therefore, all of signals CNT0 to CNT3 outputted from count circuit 282 become L level. After that, signal RESET becomes H level during the writing operation and then always maintains the H level.

As a result, count circuit 282 counts each time signal PG is activated. Therefore, count circuit 282 counts each time the writing operation is repeated, and each of signals CNT0 to CNT3 changes its potential.

Since the other operation is the same as that of FIG. 17, its description will not be repeated.

By the above operation, the semiconductor memory device in the second embodiment of the present invention decreases the write voltage to be applied to a memory cell each time the writing operation is repeated. As a result, charges can be more accurately accumulated in a memory cell, so that excessive writing can be prevented. Similar effects are produced also with respect to the case of the erasing operation.

Third Embodiment

In the semiconductor memory device in the second embodiment, in the writing operation, each time the writing operation is repeated, the write voltage is decreased. Alternately, each time the writing operation is repeated, the write voltage can be increased.

Figure 22:
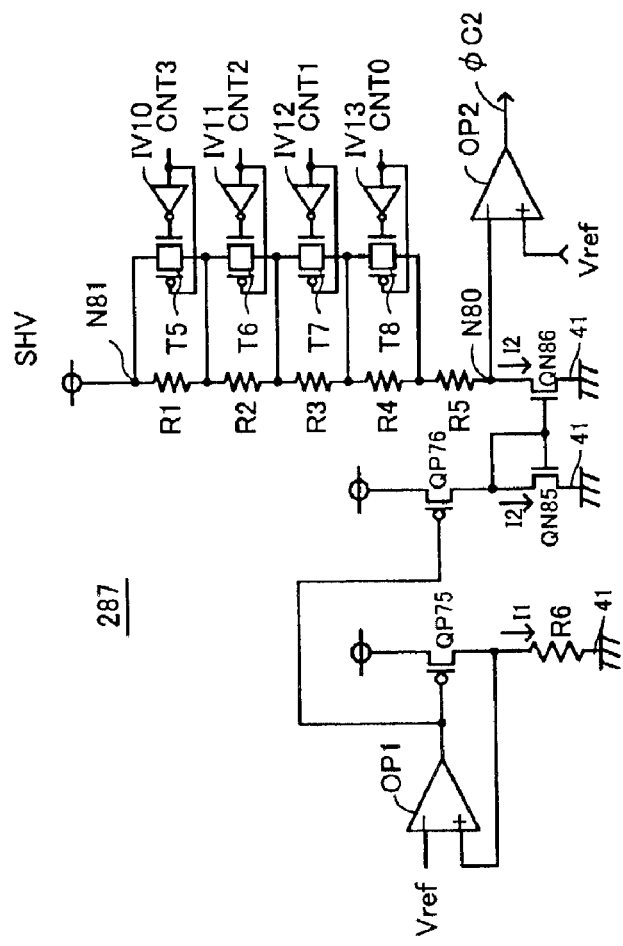
FIG. 22 is a circuit diagram showing the configuration of an HV detecting circuit of a semiconductor memory device in the third embodiment of the present invention.

FIG. 22 is a circuit diagram showing the configuration of HV detecting circuit 287 of the semiconductor memory device in a third embodiment of the present invention.

Referring to FIG. 22, HV detecting circuit 287 newly includes transfer gates T5 to T8 in place of transfer gates T1 to T4 different from FIG. 14.

Transfer gate T5 and resistive element R1 are connected in parallel. An output signal of inverter IV10 is inputted to the gate of an N-channel MOS transistor in transfer gate T5. Count signal CNT3 outputted from count circuit 282 is inputted to inverter IV10 and the gate of a P-channel MOS transistor. Transfer gate T6 and resistive element R2 are connected in parallel. To the gate of an N-channel MOS transistor in transfer gate T6, an output signal of inverter IV11 is inputted. To inverter IV11 and the gate of the P-channel MOS transistor, count signal CNT2 outputted from count circuit 282 is inputted. Transfer gate T7 and resistive element R3 are connected in parallel. To the gate of an N-channel MOS transistor T7, an output signal of inverter IV12 is inputted. To inverter IV12 and the gate of a P-channel MOS transistor, count signal CNT1 outputted from count circuit 282 is inputted. Transfer gate T8 and resistive element R4 are connected in parallel. To the gate of an N-channel MOS transistor in transfer gate T8, an output signal of inverter IV13 is inputted. To inverter IV13 and the gate of a P-channel MOS transistor, count signal CNT0 outputted from count circuit 282 is inputted.

Since the other configuration is the same as that of FIG. 14, its description will not be repeated.

Figure 23:
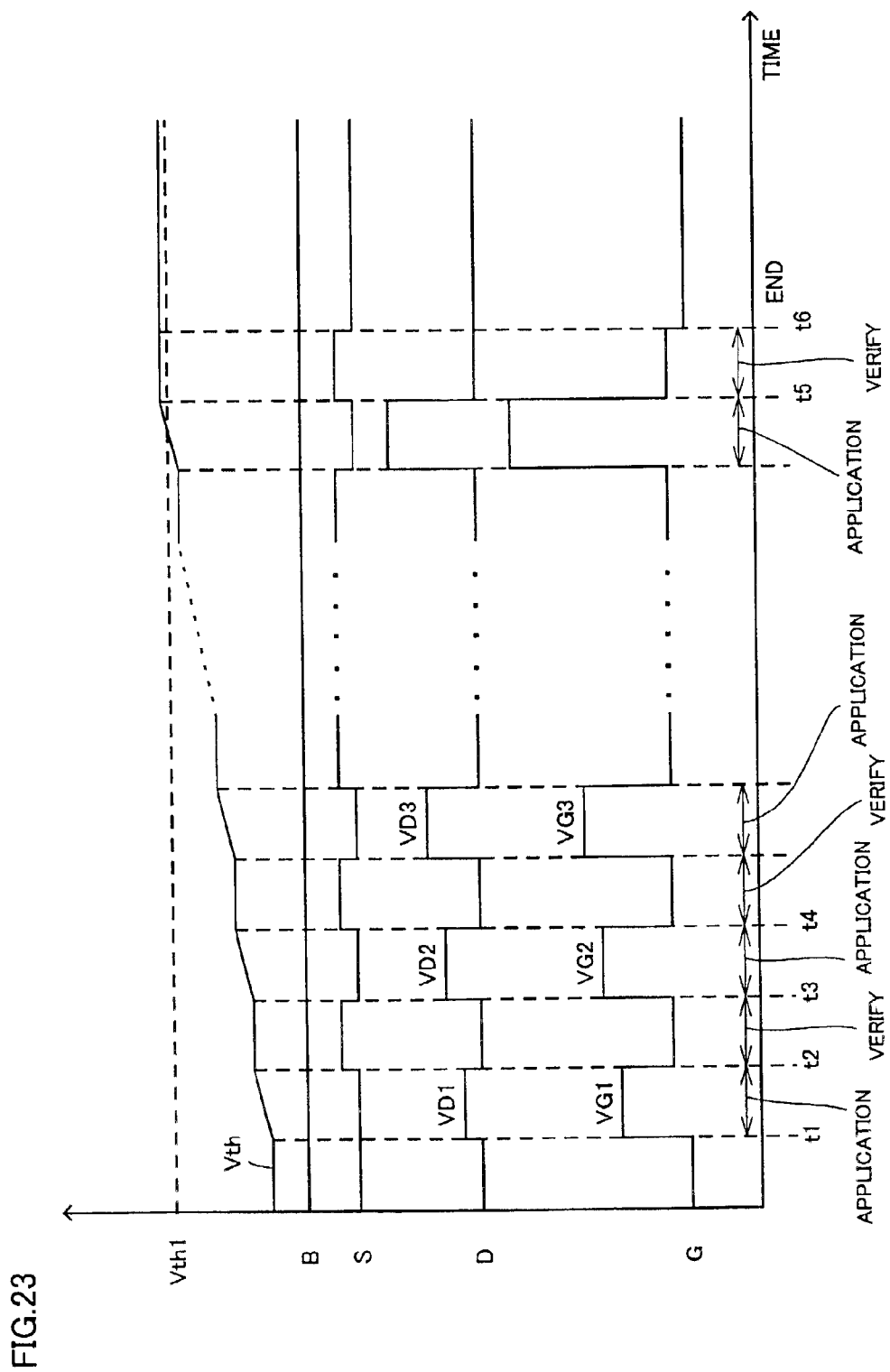
FIG. 23 is a timing chart at the time of the writing operation of the semiconductor memory device in the third embodiment of the present invention.

FIG. 23 is a timing chart showing the writing operation of a semiconductor memory device in the third embodiment of the present invention.

Referring to FIG. 23, at time t1, semiconductor memory device 100 performs application of the write voltage of the first time. At this time, the other signals PV, ER, and EV outputted from peripheral circuit 281 maintain the H level. At this time, HV detecting circuit 287, HV oscillator 291, and HV charge pump 295 operate. As a result, HV charge pump 295 outputs drain voltage HV to be applied to the memory cell.

At this time, all of count signals CNT0 to CNT3 outputted from count circuit 282 are at the L level. Since all of transfer gates T5 to T8 in HV detecting circuit 287 are turned on, only resistive element R5 is connected between nodes N80 and N81 in HV detecting circuit 287. The potential of signal HV outputted from HV charge pump 295 is divided by resistive element R5 and transistor QN86. The divided potential is outputted from node N80 to operational amplifier OP2. At this time, operational amplifier OP2 outputs signal φC2 of the H level until the voltage of a signal outputted from node N80 becomes equal to reference potential Vref. As a result, HV charge pump 295 outputs signal HV to the drain of the memory cell. At this time, signal HV is maintained at constant voltage VD1.

Similarly, by activation of signal PG, SHGV detecting circuit 285, SHGV oscillator 289, and SHGV charge pump 293 operate. As a result, SHGV charge pump 293 outputs gate signal SHGV to be applied to a memory cell. At this time, signal SHGV is maintained at constant voltage VG1.

At time t2 after the write voltage is applied for a predetermined period, signal PG becomes H level and signal PV becomes L level. As a result, semiconductor memory device 100 starts the verifying operation. Assuming now that when the threshold voltage of a memory cell becomes Vth1, sufficient charges are accumulated in storing region 9R in the memory cell, threshold voltage Vth of the memory cell at time t2 is lower than Vth1. Therefore, comparator 25 determines that charges accumulated in storing region 9R are insufficient. As a result, signal PG becomes L level at time t3, and the write voltage is applied again.

At the time of the verifying operation from time t2 to t3, the count value of count circuit 282 is set to "1". Therefore, count signal CNT0 becomes H level.

As a result, transfer gate T8 in HV detecting circuit 287 is turned off. Therefore, a voltage outputted from node N80 in HV detecting circuit 287 becomes equal to the potential obtained by dividing the potential of signal HV by resistive elements R4 and R5 and transistor QN86. Even in the case where the potential of the signal outputted from node N80 is higher than that at time t1, HV detecting circuit 287 outputs signal φC2 of the L level.

Consequently, voltage VD2 of signal HV outputted from HV charge pump 295 at time t2 is higher than voltage VD1 of signal HV at time t1.

For the same reason, voltage VG2 of signal SHGV outputted from SHGV charge pump 293 becomes higher than voltage VG1 of signal SHGV at time t1.

Subsequently, at time t4, a verifying operation is performed. Since the operating method is the same as that of the verifying operation at time t2, its description will not be repeated.

By the above operations, until threshold value Vth of the memory cell on which the writing operation is performed becomes Vth1, semiconductor memory device 100 repeats application of the write voltage and the verifying operation. Each time the number of application times of the write voltage increases, the voltage to be applied increases. When threshold value Vth of the memory cell exceeds Vth1 as a result of the verifying operation at time t5, comparator 25 outputs pulse signal VERIFY of the H level. Memory control circuit 28 receives signal VERIFY of the H level and finishes the writing operation at time t6.

By the above operation, semiconductor memory device 100 in the third embodiment repeats application of the write voltage and the verifying operation at the time of the writing operation. As a result, charges are prevented from being excessively injected into the memory cell. Further, in the third embodiment, by increasing the application voltage each time the number of application times of the write voltage increases, writing operation can be performed at higher speed.

Fourth Embodiment

Figure 24:
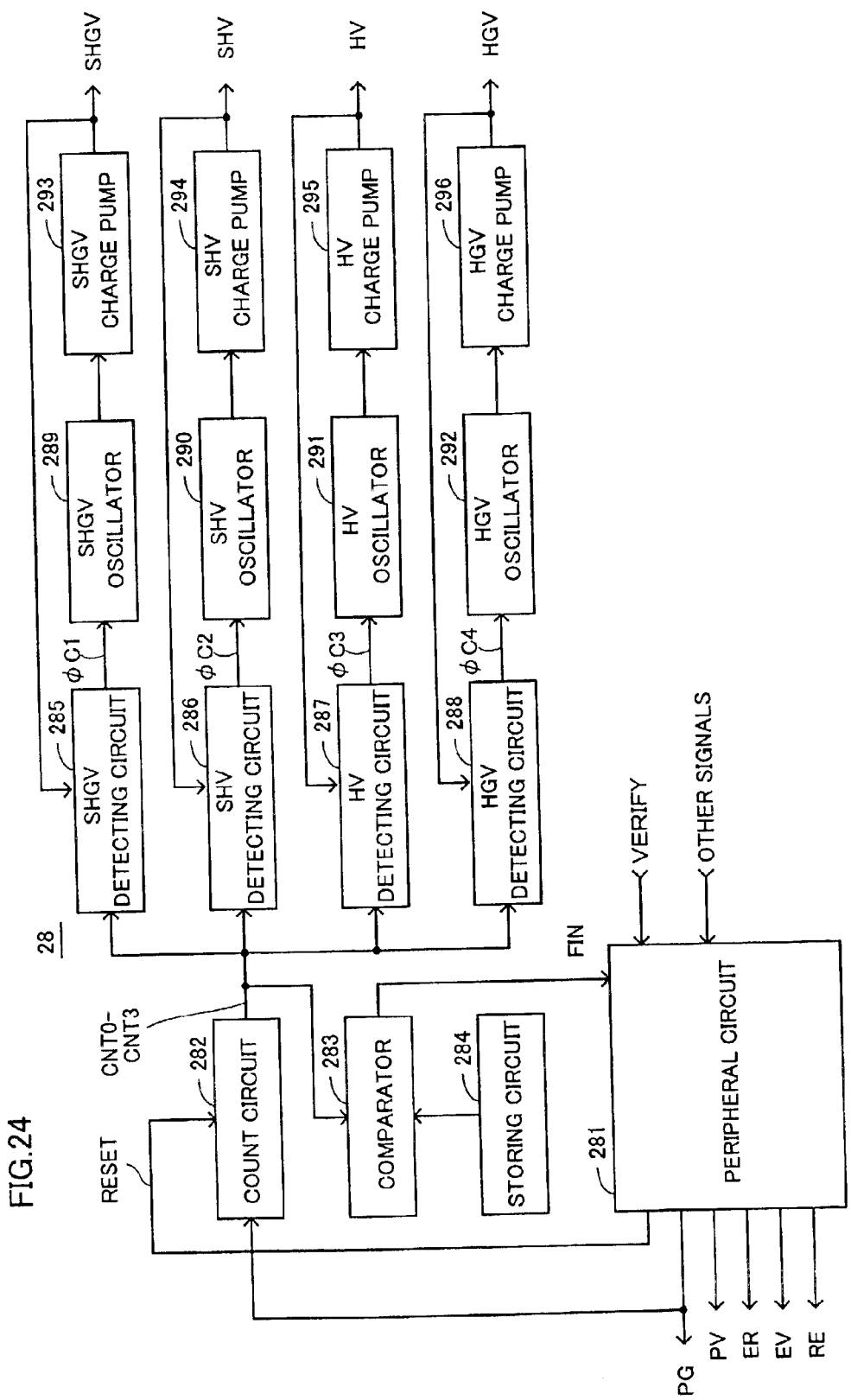
FIG. 24 is a block diagram showing a memory control circuit of a semiconductor memory device in a fourth embodiment of the present invention.

FIG. 24 is a block diagram showing a memory control circuit in a semiconductor memory device in a fourth embodiment of the present invention.

Referring to FIG. 24, different from FIG. 13, memory control circuit 28 newly includes a comparator 283 and a storing circuit 284.

Storing circuit 284 preliminarily stores the maximum number of outputting times of signal PG outputted from peripheral circuit 281.

Comparator 283 compares count values CNT0 to CNT3 outputted from count circuit 282 with the maximum output number of times of signal PG stored in storing circuit 284. When the count value of count circuit 282 reaches the maximum output number of times of signal PG stored in storing circuit 284, comparator 283 outputs a signal FIN to peripheral circuit 281. On receipt of signal FIN, peripheral circuit 281 stops outputting signals PG and PV or signals ER and EV.

Since the other configuration is similar to that of FIG. 13, its description will not be repeated.

The writing operation of semiconductor memory device 100 including memory control circuit 28 having the above-described circuit configuration will now be described.

Figure 25:
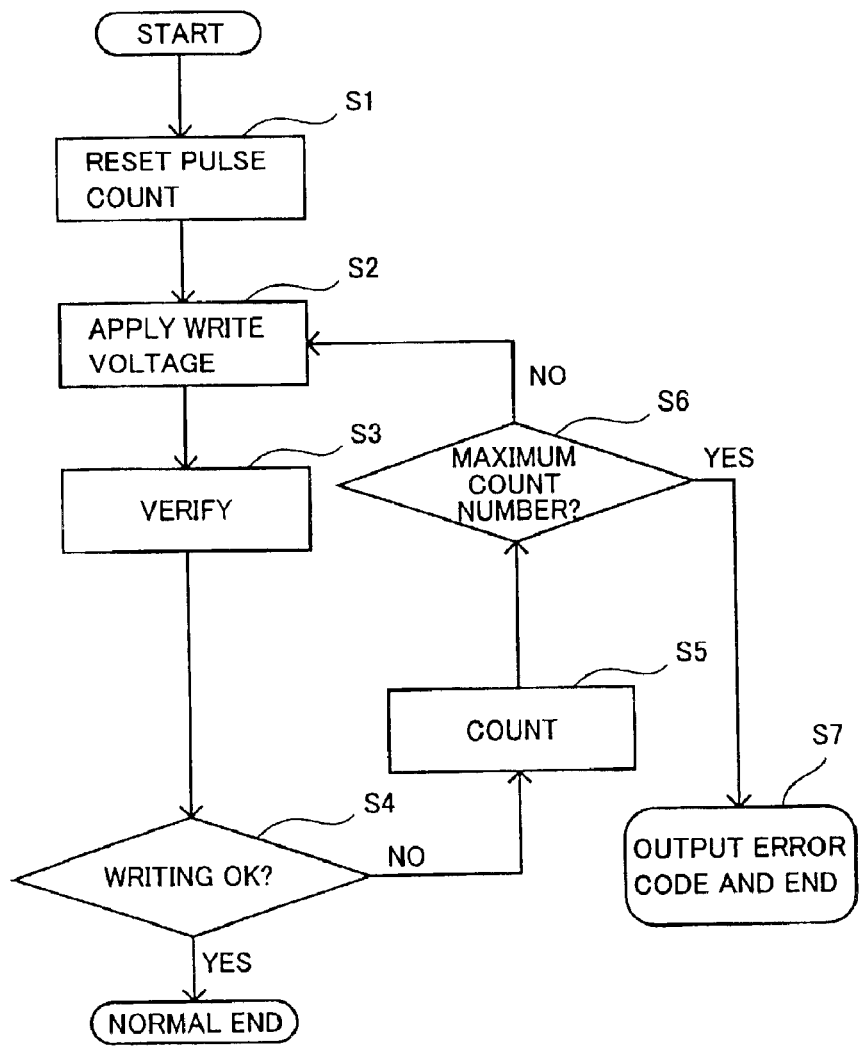
FIG. 25 is a flowchart showing the writing operation of the semiconductor memory device in the fourth embodiment.

FIG. 25 is a flowchart showing the writing operation of the semiconductor memory device in the fourth embodiment.

Referring to FIG. 25, the operation up to step S5 is the same as that in FIG. 19, so that its description will not be repeated. After counting in step S5, comparator 283 determines whether the count number of count circuit 282 exceeds the maximum count value stored in storing circuit 284 or not (step S6). In the case where comparator 283 determines that the count value of count circuit 282 does not exceed the maximum count value stored in storing circuit 284, the program returns again to step S2 and the write voltage is applied. On the contrary, in the case where comparator 283 determines that the count number of count circuit 282 exceeds the maximum count value stored in storing circuit 284, memory control circuit 28 determines that an error bit occurs, and finishes the writing operation (step S7). Memory control circuit 28 outputs an error code to the outside of the semiconductor memory device.

By the above operation, the semiconductor memory device in the fourth embodiment can regulate the number of writing operations. With respect to the erasing operation, operations similar to the above are executed.

In the first to fourth embodiments, as an example of the writing operation, the writing operation on storing region 9R in a memory cell in a state where data is not accumulated in storing regions 9R and 9L has been described. However, a writing operation onto storing region 9R in a state where data is prestored in storing region 9L can be performed in a manner similar to the case where data is not stored in storing region 9L. Although the writing operation on a memory cell capable of storing two bits has been described in the first to fourth embodiments, data can be written or erased to/from a memory call capable of storing one bit by a similar operation.

Fifth Embodiment

Resistance to the total number of writing operations or the total number of erasing operations in a flash EEPROM having a floating gate and that of an NROM are different from each other.

Figure 26A:
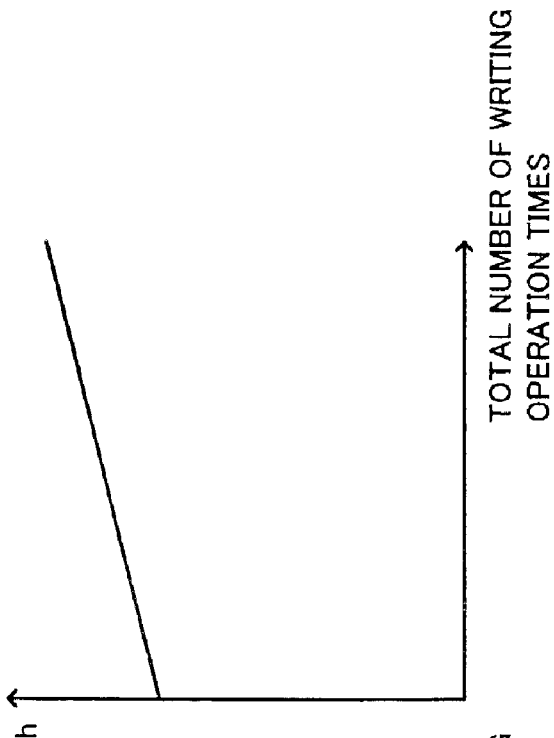
FIGS. 26A and 26B are graphs showing resistance to the total number of writing operations in a flash EEPROM and that in an NROM.
Figure 26B:
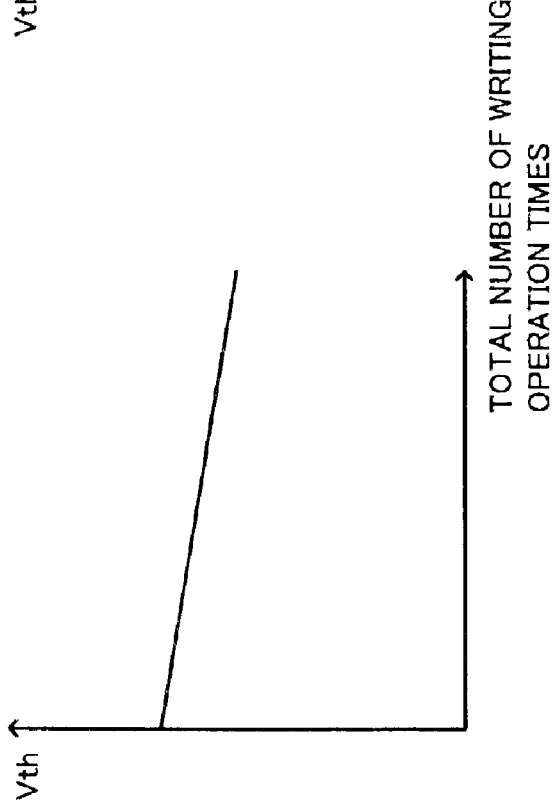

FIGS. 26A and 26B are graphs showing resistance to the total number of writing operations in a memory cell having a floating gate and that in an MONOS type memory cell, respectively.

As shown in FIG. 26A, in the memory cell having a floating gate, as the total number of writing operations increases, the threshold value decreases. However, as shown in FIG. 26B, in the MONOS type memory cell, as the total number of writing operations increases, the threshold value increases.

Increase in the threshold value causes insufficient erasure at the time of the erasing operation, and there is the possibility that data is destroyed. In the MONOS type memory cell, therefore, it is necessary to suppress increase in the threshold value. In the case of the MONOS type memory cell, to suppress increase in the threshold value, it is sufficient to decrease the write voltage as the total number of writing operations increases.

Figure 27:
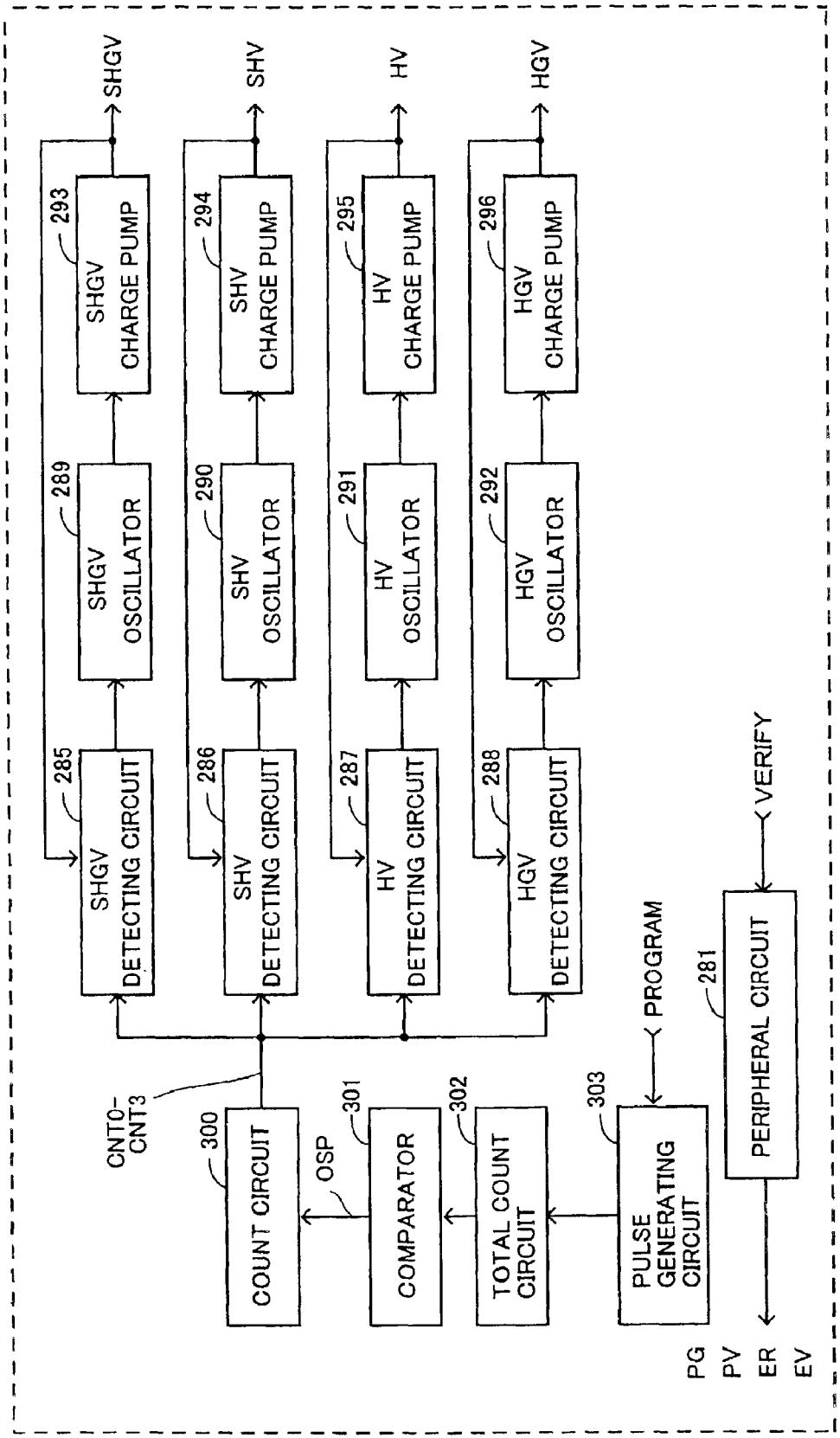
FIG. 27 is a block diagram showing the configuration of a memory control circuit of a semiconductor memory device in a fifth embodiment of the present invention.

FIG. 27 is a block diagram showing the configuration of a memory control circuit in a semiconductor memory device in the fifth embodiment of the present invention.

Referring to FIG. 27, different from FIG. 13, in place of count circuit 282, a count circuit 300 is newly disposed and, further, a comparator 301, a total count circuit 302, and a pulse generating circuit 303 are added.

Count circuit 300 is a 4-bit counter like count circuit 282 and outputs count signals CNT0 to CNT3. Count circuit 300 is not reset by peripheral circuit 281.

In response to an internal signal PROGRM which is constantly in an active state when the semiconductor memory device is in a writing operation mode, pulse generating circuit 303 outputs a one-shot pulse signal.

Total count circuit 302 is a 20-bit counter, and counts up each time a one-shot pulse signal is outputted from pulse generating circuit 303. Therefore, total count circuit 302 counts the total count number of writing operation commands entered after semiconductor memory device 100 is shipped. Total count circuit 302 includes a nonvolatile memory transistor. The nonvolatile memory transistor stores the total number of counts.

Comparator 301 outputs a one-shot pulse signal OSP when the count value of total count circuit 302 becomes a predetermined value. Each time total count circuit 302 reaches, for example, 100, 1000, 10,000, or 100,000, comparator 301 outputs one-shot pulse signal OSP.

Count circuit 300 counts up each time one-shot pulse signal OSP is received. The circuit configuration of SHGV detecting circuit 285, SHV detecting circuit 286, HV detecting circuit 287, and HGV detecting circuit 288 is as shown in FIG. 14.

As a result, each time count circuit 300 counts up, a sense voltage of each detecting circuit decreases. Thus, as the total number of writing operations increases, the write voltage can be decreased.

Sixth Embodiment

In the foregoing first to fifth embodiments, the writing operation and the erasing operation in the case of using the MONOS type memory cell shown in FIG. 30 has been described.

Figure 28:
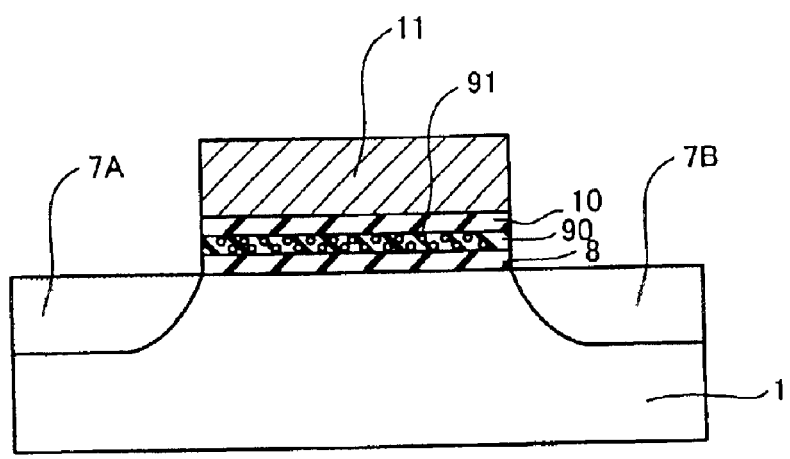
FIG. 28 is a cross sectional view of an NROM using a polysilicon film as a charge accumulating layer.
Figure 29:
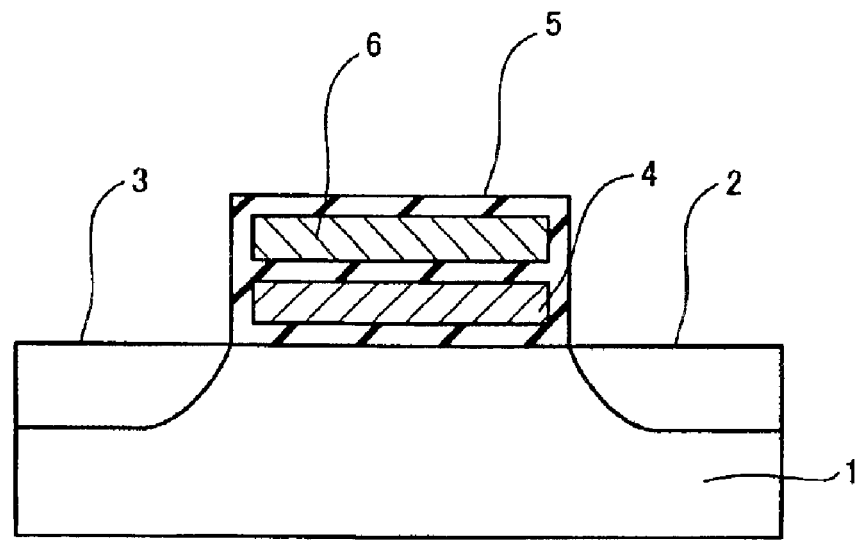
FIG. 29 is a cross sectional view of a conventional flash EEPROM.

However, in the MONOS type memory cell in FIG. 30, in place of the nitride film 9 playing the role of a charge accumulating layer, a gate insulating film using a granular silicon buried oxide film 90 as a charge accumulating layer as shown in FIG. 28 can be used. Granular silicon buried oxide film 90 includes a plurality of polysilicon grains 91. The MONOS type memory cell shown in FIG. 28 is expected to realize improved data retaining characteristic and reduced variations in the threshold value at the time of a writing operation as compared with the case of FIG. 30.

Although the present invention has been described and illustrated in detail, it is clearly understood that the same is by way of illustration and example only and is not to be taken by way of limitation, the spirit and scope of the present invention being limited only by the terms of the appended claims.

What is claimed:

1. A nonvolatile semiconductor memory device comprising:
   a semiconductor substrate;
   a plurality of memory blocks including a plurality of nonvolatile memory cells arranged in a matrix;
   a plurality of word lines arranged in correspondence with a row direction of said plurality of memory cells;
   a plurality of bit lines arranged in correspondence with a column direction of said plurality of memory cells; and
   a control circuit for performing a writing operation on said plurality of memory cells at the time of a writing operation, wherein
   each of said plurality of memory cells includes:
   first and second conductive regions formed in a main surface of said semiconductor substrate and connected to corresponding bit lines in said plurality of bit lines; and
   an insulating film formed on said semiconductor substrate between said first and second conductive regions, having a first storing region in the vicinity of said first conductive region and a second storing region in the vicinity of said second conductive region, and
   said control circuit applies at least one pulse voltage to a selected memory cell in said plurality of memory cells,
   the memory device further comprising a counter for counting the number of times said control circuit has performed the writing operation since the memory device was shipped, wherein
   said control circuit varies the magnitude of a pulse voltage to be applied to a selected memory cell based on the number of times counted by said counter.

2. The nonvolatile semiconductor memory device according to claim 1, further comprising
   a verifying circuit for performing a verifying operation on said selected memory cell each time said control circuit applies said pulse voltage.

3. The nonvolatile semiconductor memory device according to claim 2, wherein a voltage applied to said first conductive region at the time of the writing operation is higher than a voltage applied to said second conductive region, and a voltage applied to said first conductive region at the time of a reading operation is lower than a voltage applied to said second conductive region.

4. The nonvolatile semiconductor memory device according to claim 3, further comprising a count circuit for counting the number of said pulse voltages applied by said control circuit to said selected memory cell, wherein said count circuit stops operation of said control circuit when the number of pulse voltages applied to said selected memory cell exceeds a predetermined number of times in each writing operation.

5. The nonvolatile semiconductor memory device according to claim 1, further comprising a sense amplifier circuit for reading data stored in each of said plurality of memory cells.

6. A nonvolatile semiconductor memory device comprising:

a semiconductor substrate;

a plurality of memory blocks including a plurality of nonvolatile memory cells arranged in a matrix;

a plurality of word lines arranged in correspondence with a row direction of said plurality of memory cells;

a plurality of bit lines arranged in correspondence with a column direction of said plurality of memory cells; and a control circuit for performing a writing operation on said plurality of memory cells at the time of a writing operation, wherein each of said plurality of memory cells includes:

first and second conductive regions formed in a main surface of said semiconductor substrate and connected to corresponding bit lines in said plurality of bit lines; and an insulating film formed on said semiconductor substrate between said first and second conductive regions, having a first storing region in the vicinity of said first conductive region and a second storing region in the vicinity of said second conductive region, and said control circuit applies at least one pulse voltage to a selected memory cell in said plurality of memory cells, said nonvolatile semiconductor memory device further comprising a sense amplifier circuit for reading data stored in each of said plurality of memory cells, wherein said sense amplifier circuit is a single end type sense amplifier circuit.

7. A nonvolatile semiconductor memory device comprising:

a semiconductor substrate;

a plurality of memory blocks including a plurality of nonvolatile memory cells arranged in a matrix;

a plurality of word lines arranged in correspondence with a row direction of said plurality of memory cells;

a plurality of bit lines arranged in correspondence with a column direction of said plurality of memory cells; and a control circuit for performing a writing operation on said plurality of memory cells at the time of a writing operation, wherein each of said plurality of memory cells includes:

first and second conductive regions formed in a main surface of said semiconductor substrate and connected to corresponding bit lines in said plurality of bit lines; and an insulating film formed on said semiconductor substrate between said first and second conductive regions, having a first storing region in the vicinity of said first conductive region and a second storing region in the vicinity of said second conductive region, and said control circuit applies at least one pulse voltage to a selected memory cell in said plurality of memory cells, said nonvolatile semiconductor memory device further comprising a sense amplifier circuit for reading data stored in each of said plurality of memory cells, wherein said sense amplifier circuit includes a differential amplifier circuit which receives data of each of said plurality of memory cells and a reference potential.

8. The nonvolatile semiconductor memory device according to claim 7, wherein said sense amplifier circuit further includes a reference potential generating circuit for generating said reference potential, and said reference potential generating circuit includes a plurality of reference cells operating at the time of a reading or writing operation.

9. A nonvolatile semiconductor memory device comprising:

a semiconductor substrate;

a plurality of memory blocks including a plurality of nonvolatile memory cells arranged in a matrix;

a plurality of word lines arranged in correspondence with a row direction of said plurality of memory cells;

a plurality of bit lines arranged in correspondence with a column direction of said plurality of memory cells; and a control circuit for performing a writing operation on said plurality of memory cells at the time of a writing operation, wherein each of said plurality of memory cells includes:

first and second conductive regions formed in a main surface of said semiconductor substrate and connected to corresponding bit lines in said plurality of bit lines; and an insulating film formed on said semiconductor substrate between said first and second conductive regions, having a first storing region in the vicinity of said first conductive region and a second storing region in the vicinity of said second conductive region, and said control circuit applies at least one pulse voltage to a selected memory cell in said plurality of memory cells, said nonvolatile semiconductor memory device further comprising a sense amplifier circuit for reading data stored in each of said plurality of memory cells, wherein said sense amplifier circuit includes:

a differential amplifier circuit which receives data of each of said plurality of memory cells and a reference potential; and a reference potential generating circuit for generating said reference potential, said reference potential generating circuit including a plurality of reference cells operating at the time of a reading or writing operation, wherein said plurality of reference cells includes:

a read reference cell operating in a reading operation; and a write reference cell operating in a writing operation and having a threshold value different from that of said read reference cell.

10. The nonvolatile semiconductor memory device according to claim 9, wherein the threshold value of said write reference cell is higher than the threshold value of said read reference.

* * * * *